(12) United States Patent  
Saitoh et al.

(10) Patent No.: US 12,069,883 B2
(45) Date of Patent: Aug. 20, 2024

(54) DISPLAY DEVICE

(71) Applicant: SHARP KABUSHIKI KAISHA, Sakai (JP)

(72) Inventors: Takao Saitoh, Sakai (JP); Masahiko Miwa, Sakai (JP); Yohsuke Kanzaki, Sakai (JP); Masaki Yamanaka, Sakai (JP); Yi Sun, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 601 days.

(21) Appl. No.: 17/422,098

(22) PCT Filed: Jan. 17, 2019

(86) PCT No.: PCT/JP2019/001213
§ 371 (c)(1),
(2) Date: Jul. 9, 2021

(87) PCT Pub. No.: WO2020/148852
PCT Pub. Date: Jul. 23, 2020

(65) Prior Publication Data
US 2022/0115626 A1    Apr. 14, 2022

(51) Int. Cl.
| | | |
|---|---|---|
| H01L 51/52 | (2006.01) | |
| H01L 27/32 | (2006.01) | |
| H01L 51/56 | (2006.01) | |
| H10K 50/844 | (2023.01) | |
| H10K 59/131 | (2023.01) | |
| H10K 71/00 | (2023.01) | |
| H10K 59/12 | (2023.01) | |
| H10K 77/10 | (2023.01) | |
| H10K 102/00 | (2023.01) | |

(52) U.S. Cl.
CPC ......... *H10K 50/844* (2023.02); *H10K 59/131* (2023.02); *H10K 71/00* (2023.02); *H10K 59/1201* (2023.02); *H10K 77/111* (2023.02); *H10K 2102/311* (2023.02)

(58) Field of Classification Search
CPC ............. H10K 50/844; H10K 59/1201; H10K 59/124; H10K 59/131; H10K 59/179; H10K 71/00; H10K 77/111; H10K 2102/311
See application file for complete search history.

(56) References Cited

U.S. PATENT DOCUMENTS

| | | |
|---|---|---|
| 2014/0353670 A1 | 12/2014 | Youn et al. |
| 2015/0287750 A1 | 10/2015 | Youn et al. |
| 2017/0277288 A1 | 9/2017 | Choi et al. |

(Continued)

FOREIGN PATENT DOCUMENTS

| | | |
|---|---|---|
| JP | 2014-232300 A | 12/2014 |
| JP | 2017-187581 A | 10/2017 |

*Primary Examiner* — David C Spalla
(74) *Attorney, Agent, or Firm* — ScienBiziP, P.C.

(57) ABSTRACT

A first resin layer is provided to fill a slit formed in at least one inorganic insulating film included in a TFT layer, and extending in a longitudinal direction of a fold portion. A plurality of first routed wires are provided above the first resin layer, and extending in parallel with one another and intersecting with the longitudinal direction of the fold portion. A first protective layer is formed between, and in contact with, the first resin layer and the first routed wires, and provided to at least partially coincide with each of the first routed wires.

20 Claims, 20 Drawing Sheets

(56) References Cited

U.S. PATENT DOCUMENTS

| | | | | |
|---|---|---|---|---|
| 2018/0047802 A1* | 2/2018 | Yoon | ............... | H10K 59/1213 |
| 2018/0151662 A1* | 5/2018 | Rhe | ............... | H10K 59/40 |
| 2019/0341442 A1* | 11/2019 | Kajiyama | ............... | G09F 9/30 |
| 2019/0363153 A1* | 11/2019 | Matsui | ............... | H05B 33/10 |
| 2020/0194718 A1* | 6/2020 | Kishimoto | ............... | H10K 50/00 |
| 2020/0303490 A1* | 9/2020 | Tomioka | ............... | H10K 59/131 |

* cited by examiner

DISPLAY DEVICE

TECHNICAL FIELD

The disclosure relates to a display device.

BACKGROUND ART

In recent years, light-emitting organic electroluminescence (EL) display devices using organic EL elements are drawing attention as a replacement for liquid crystal display devices. Of these organic EL devices, a proposed flexible organic EL device includes a flexible resin substrate and such components as organic EL elements formed on the resin substrate. The flexible organic EL display device includes a display region displaying an image and a frame region provided around the display region. Desirably, the frame region is reduced in size. When the frame region of such a flexible organic EL display device is folded so that the area of the frame region is reduced in plan view, wires arranged in the frame region could be broken.

Patent Document 1 discloses, for example, a flexible display device including a bending hole. Portions of a buffer film, a gate insulating film, and an interlayer insulating film corresponding to an area of the bending hole are removed to prevent breaks of the wires.

CITATION LIST

Patent Literature

[Patent Document] Japanese Unexamined Patent Application Publication No. 2014-232300

SUMMARY

Technical Problem

A flexible organic EL display device includes a resin substrate and such inorganic insulating films as a base-coat film, a gate insulating film, and an interlayer insulating film provided on the resin substrate. In order to reduce the risk of wires to be broken in the frame region, the wires can be formed in the following steps: removing the inorganic insulating films in a fold portion of the frame region, forming a planarization film in the removed portion, and forming on the planarization film a plurality of wires extending in parallel with one an other. Here, in forming the wires on the planarization film, a metal film is deposited on the planarization film and patterned by dry-etching. With such a technique, the surface of the planarization film made of a resin material is also etched, causing a possible risk of contamination inside the chamber of the dry-etching apparatus.

In view of the above problem, the disclosure is intended to reduce contamination inside a chamber of a dry-etching apparatus.

Solution to Problem

In order to solve the above problem, a display device according to the present invention includes: a resin substrate defining a display region, a frame region around the display region, a terminal unit at an end of the frame region, and a fold portion provided between the terminal unit and the display region and extending in a single direction; a TFT layer provided on the resin substrate, and including a plurality of display wires formed in the display region, the display wires extending in parallel with one an other, and intersecting with a longitudinal direction of the fold portion; a plurality of light-emitting elements provided on the TFT layer and included in the display region; a plurality of terminals included in the terminal unit and arranged in the longitudinal direction of the fold portion; at least one inorganic insulating film provided on the resin substrate, included in the TFT layer, and including a slit formed in the longitudinal direction of the fold portion; a first resin layer provided to fill the slit; a plurality of first routed wires provided above the first resin layer, extending in parallel with one an other and intersecting with the longitudinal direction of the fold portion, and each electrically connected to a corresponding one of the display wires toward the display region and to a corresponding one of the terminals toward the terminal unit; and a first protective layer formed between, and in contact with, the first resin layer and the first routed wires, and provided to at least partially coincide with each of the first routed wires.

Advantageous Effects of Disclosure

According to the disclosure, a first protective layer is formed between, and in contact with, a first resin layer and first routed wires, and is provided to at least partially coincide with each of the first routed wires. Such a feature makes it possible to reduce the risk of contamination inside a chamber of a dry-etching apparatus.

DESCRIPTION OF EMBODIMENTS

Described below in derail are embodiments of the disclosure, with reference to the drawings. Note that the disclosure shall not be limited to the embodiments below.

First Embodiment

Figure 1:
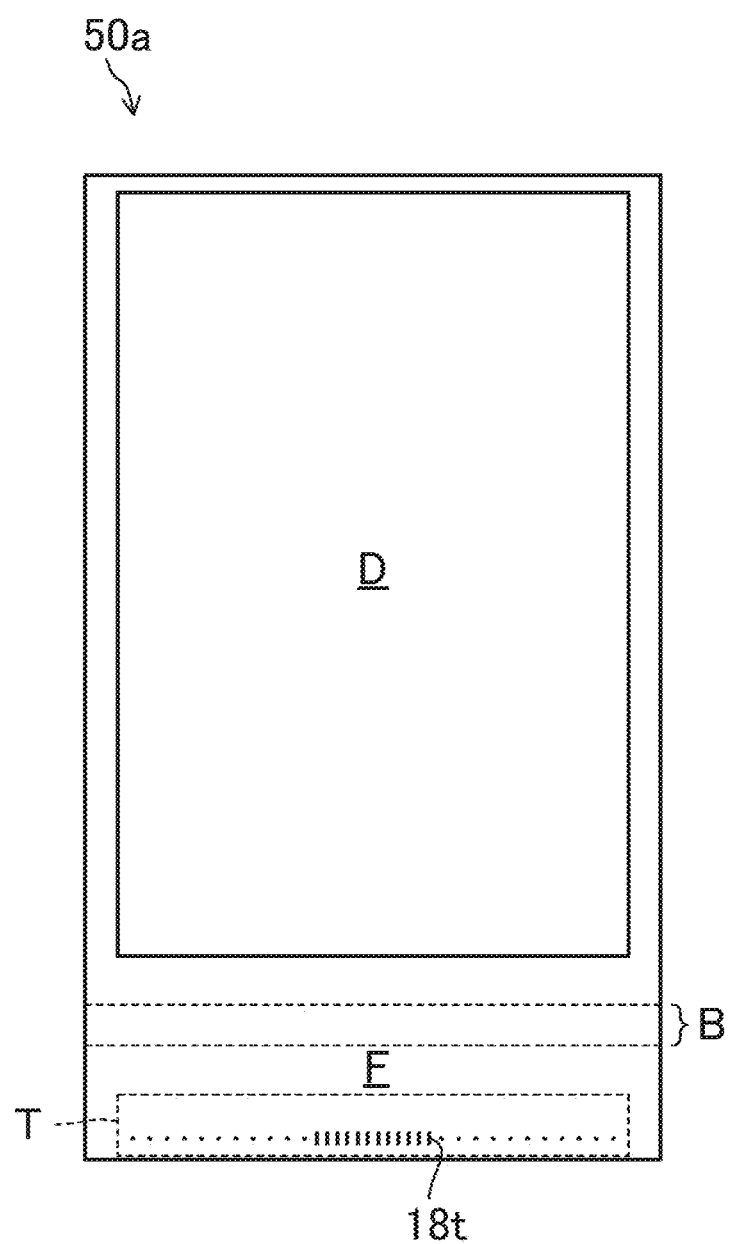
FIG. 1 is a plan view illustrating a schematic configuration of an organic EL display device according to a first embodiment of the disclosure.
Figure 2:
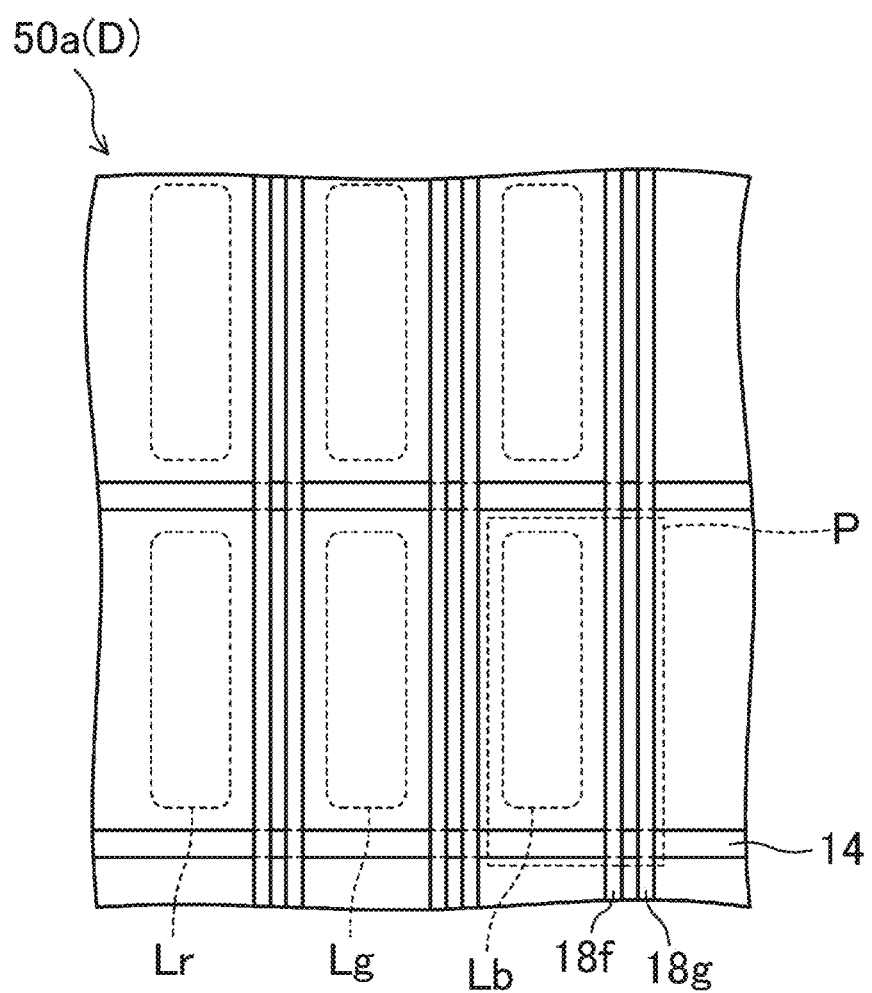
FIG. 2 is a plan view illustrating a detailed configuration of a display region of the organic EL display device according to the first embodiment of the disclosure.
Figure 3:
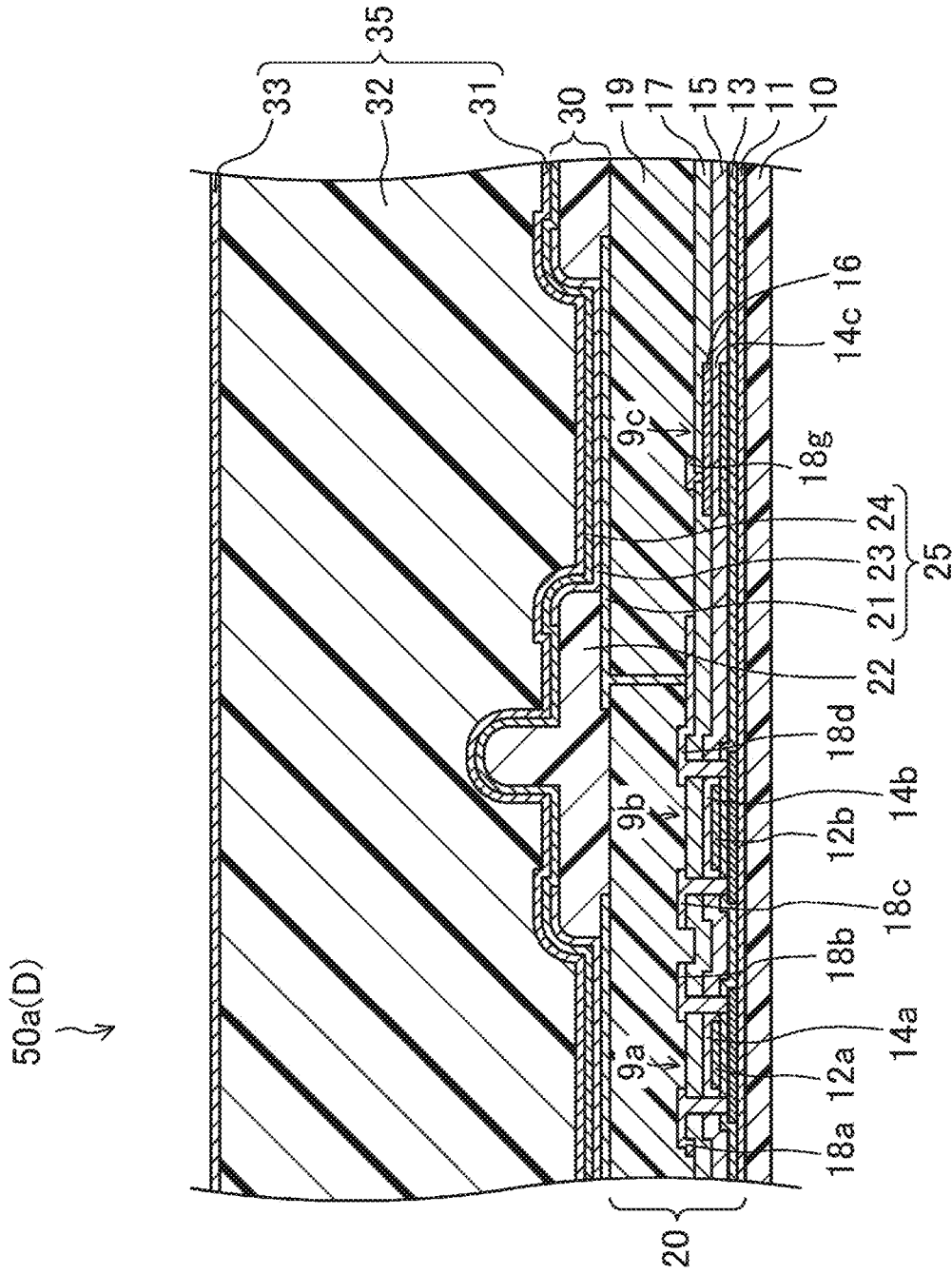
FIG. 3 is a cross-sectional view illustrating the display region of the organic EL display device according to the first embodiment of the disclosure.
Figure 4:
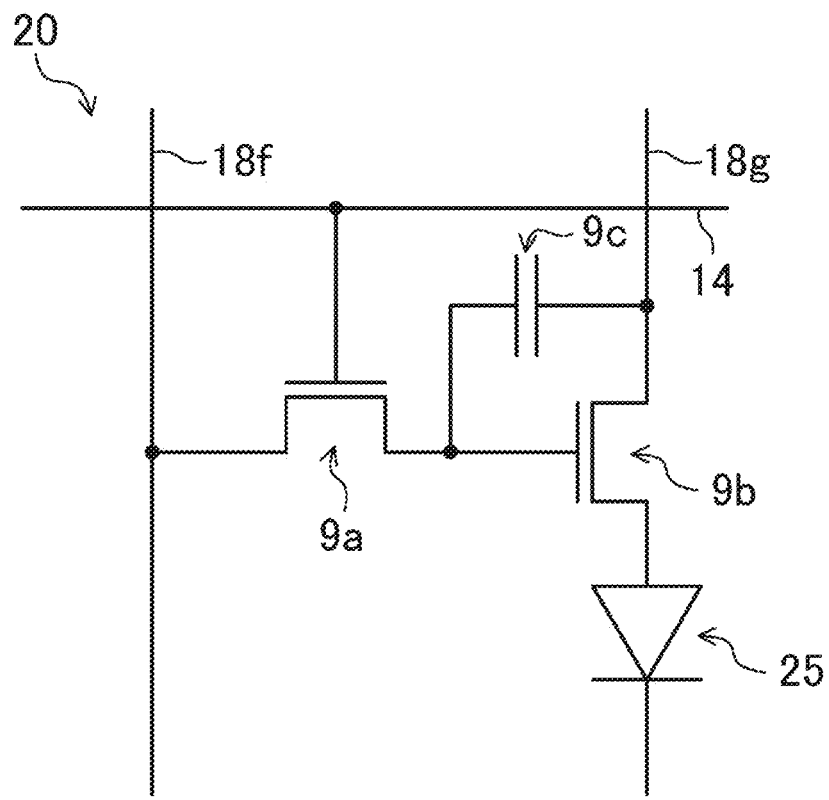
FIG. 4 is an equivalent circuit diagram illustrating a thin-film transistor (TFT) layer included in the organic EL display device according to the first embodiment of the disclosure.
Figure 5:
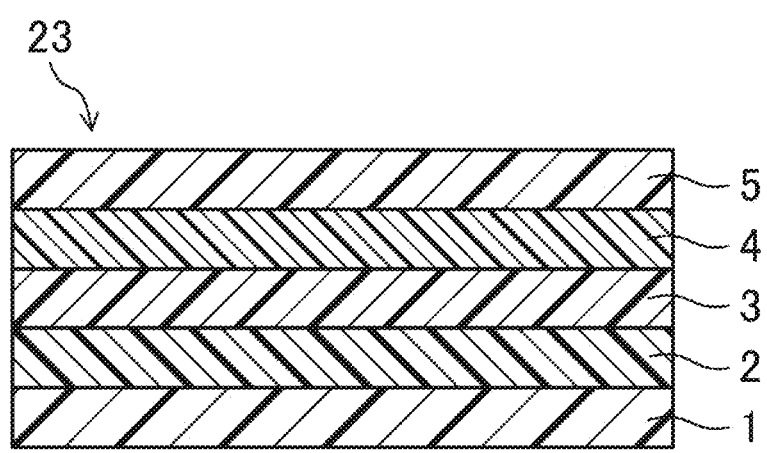
FIG. 5 is a cross-sectional view illustrating an organic EL layer included in the organic EL display device according to the first embodiment of the disclosure.
Figure 6:
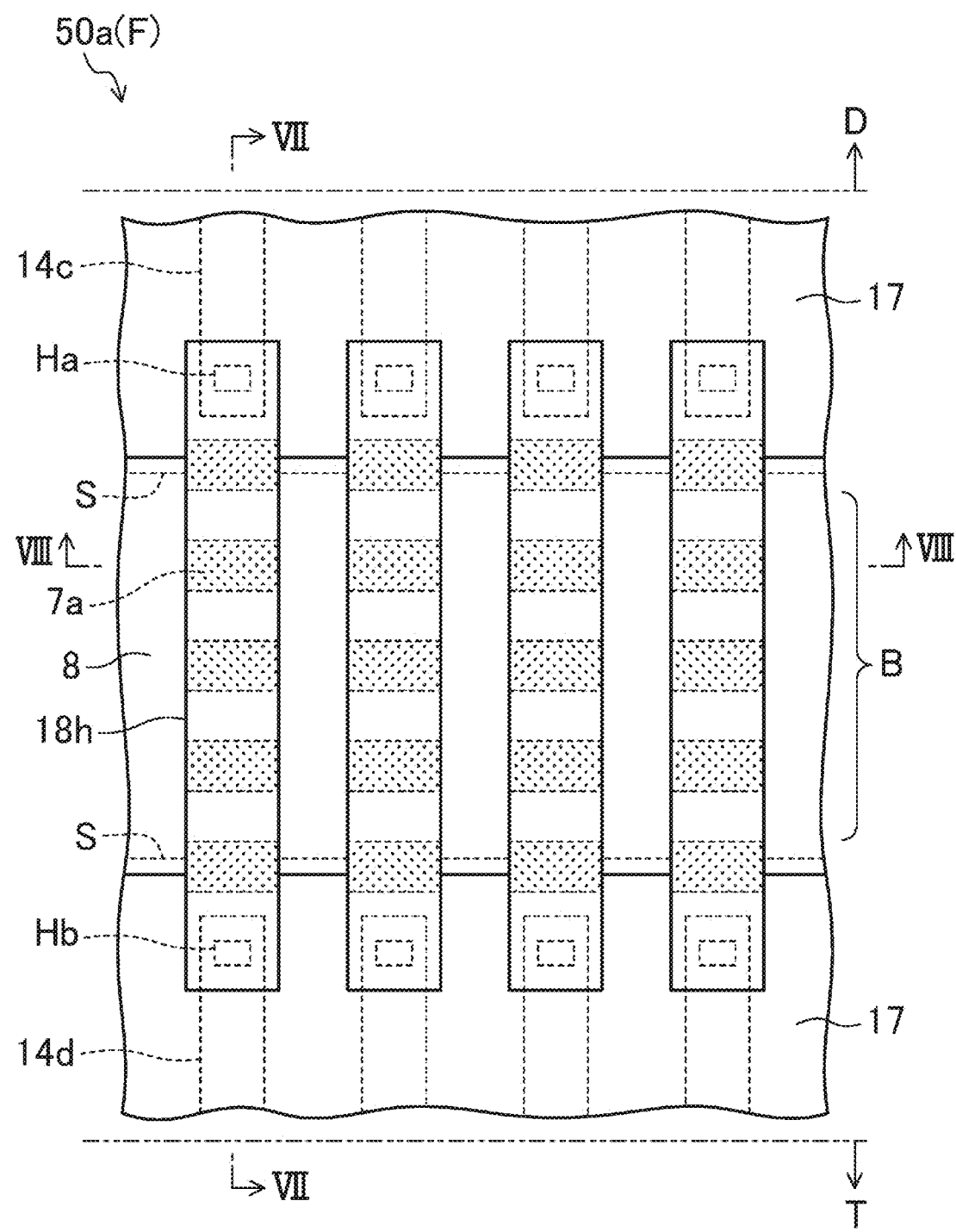
FIG. 6 is a plan view illustrating a frame region of the organic EL display device according to the first embodiment of the disclosure.
Figure 7:
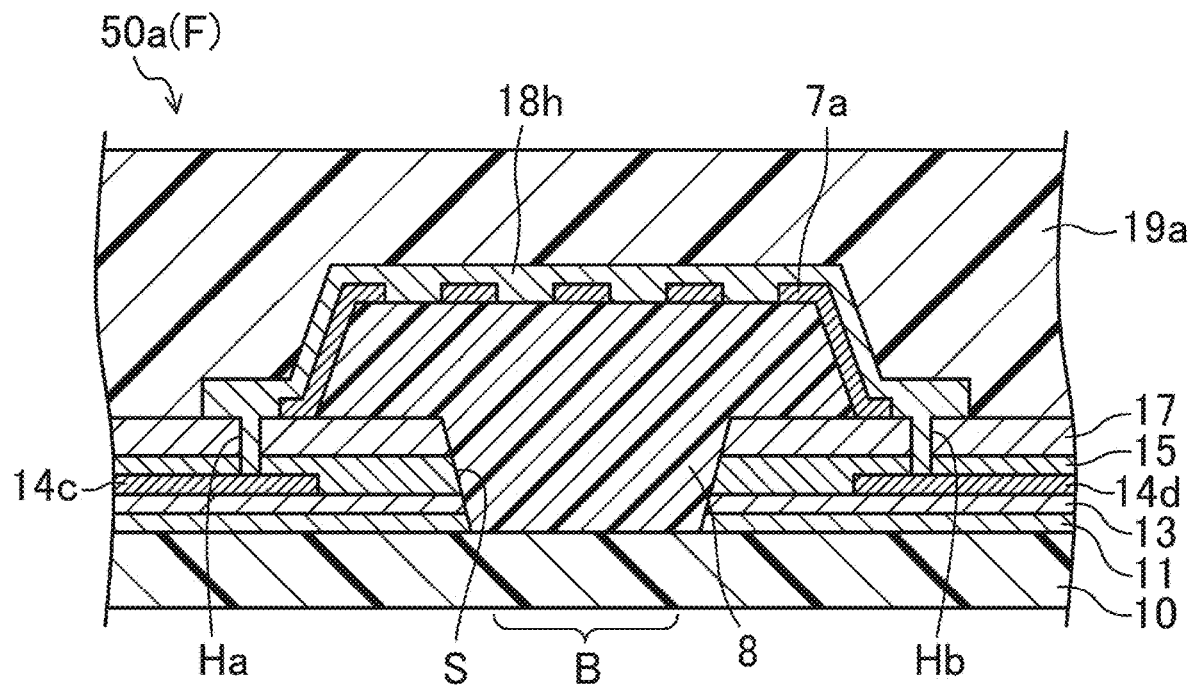
FIG. 7 is a cross-sectional view of the frame region included in the organic EL display device, the cross-sectional view being taken from line VII-VII in FIG. 6.
Figure 8:
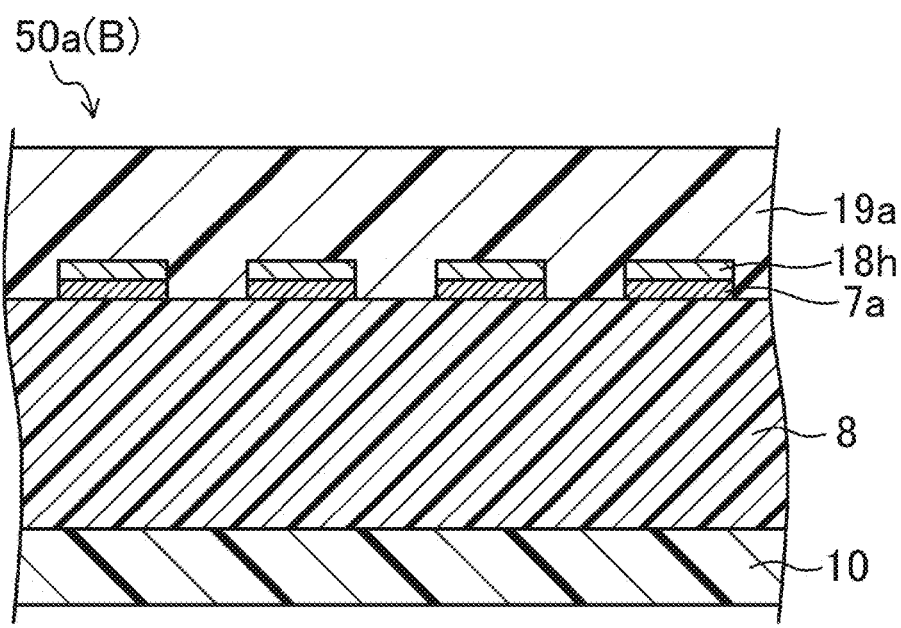
FIG. 8 is a cross-sectional view of a fold portion in the frame region included in the organic EL display device, the cross-sectional view being taken from line VIII-VIII in FIG. 6.

FIGS. 1 to 14 illustrate a first embodiment of a display device according to the disclosure. The embodiments below exemplify an organic EL display device including an organic EL element, as a display device including a light-emitting element. FIG. 1 is a plan view illustrating a schematic configuration of an organic EL display device 50a according to this embodiment. FIG. 2 is a plan view illustrating a detailed configuration of a display region D of the organic EL display device 50a. FIG. 3 is a cross-sectional view illustrating the display region D of the organic EL display device 50a. FIG. 4 is an equivalent circuit diagram illustrating a TFT layer 20 included in the organic EL display device 50a. FIG. 5 is a cross-sectional view illustrating an organic EL layer 23 included in the organic EL display device 50a. FIG. 6 is a plan view illustrating a frame region F of the organic EL display device 50a. FIG. 7 is a cross-sectional view of the frame region F included in the organic EL display device 50a, the cross-sectional view being taken from line VII-VII in FIG. 6. FIG. 8 is a cross-sectional view of a fold portion B in the frame region F included in the organic EL display device 50a, the cross-sectional view being taken from line VIII-VIII in FIG. 6.

As illustrated in FIG. 1, the organic EL display device 50a includes, for example: the display region D shaped into a rectangle and displaying an image; and the frame region F shaped into a frame and provided around the display region D. Note that, in this embodiment, the display area D is, for example, rectangular. Examples of the rectangle include such substantial rectangles as a rectangle having arc-like sides, a rectangle having rounded corners, and a rectangle having partially notched sides.

As illustrated in FIG. 2, the display region D includes a plurality of sub-pixels P arranged in a matrix. In the display region D, as illustrated in FIG. 2, for example, the sub-pixels P having red light-emitting regions Lr for glowing red, the sub-pixels P having green light-emitting regions Lg for glowing green, and the sub-pixels P having blue light-emitting areas Lb for glowing blue are provided next to each other. Note that, in the display region D, for example, neighboring three of the sub-pixels P each having one of a red light-emitting region Lr, a green light-emitting region Lg, and a blue light-emitting region Lb constitute one pixel.

In FIG. 1, the frame region F has a center-lower end provided with a terminal unit T. As illustrated in FIG. 1, the frame region F includes a fold portion B between the display region D and the terminal unit T. The fold portion B, extending in a single direction (a horizontal direction in the drawing), is foldable around a folding axis in the horizontal direction at an angle of, for example, 180° (foldable in a U-shape). Furthermore, as illustrated in FIG. 1, the terminal unit T includes a plurality of terminals 18t arranged in the longitudinal direction of the fold portion B (the horizontal direction in the drawing).

As illustrated in FIG. 3, the display region D of the organic EL display device 50a includes: a resin substrate layer 10 provided as a resin substrate; a TFT layer 20 provided on the resin substrate layer 10; an organic EL element layer 30 provided on the TFT layer 20; and a sealing film 35 provided on the organic EL element layer 30.

The resin substrate layer 10 is made of, for example, polyimide resin.

As illustrated in FIG. 3, the TFT layer 20 includes: a base coat film 11 provided on the resin substrate layer 10; a plurality of first TFTs 9a, a plurality of second TFTs 9b, and a plurality of capacitors 9c provided on the base coat film 11; and a planarization film 19 provided on the first TFTs 9a, the second TFTs 9b, and the capacitors 9c. As illustrated in FIGS. 2 and 4, the TFT layer 20 includes a plurality of gate lines 14 horizontally extending in parallel with one an other in the drawings. Moreover, as illustrated in FIGS. 2 and 4, the TFT layer 20 includes a plurality of source lines 18f vertically extending in parallel with one an other in the drawings. Furthermore, as illustrated in FIGS. 2 and 4, the TFT layer 20 includes a plurality of power source lines 18g vertically extending in parallel with one an other in the drawings. Note that, as illustrated in FIG. 2, the power source lines 18g and the source lines 18f are provided next to each other. In the TFT layer 20, as illustrated in FIG. 4, each of the sub-pixels P includes a first TFT 9a, a second TFT 9b, and a capacitor 9c.

The base coat film 11 is, for example, a monolayer inorganic insulating film made of such materials as silicon nitride, silicon oxide, and silicon oxide nitride, or a multi-layer inorganic insulating film made of these materials.

As illustrated in FIG. 4, in each sub-pixel P, the first TFT 9a is electrically connected to the corresponding gate line 14 and source line 18f. The first TFT 9a illustrated in FIG. 3 includes: a semiconductor layer 12a; a gate insulating film 13; a gate electrode 14a; a first interlayer insulating film 15; a second interlayer insulating film 17; and a source electrode 18a and a drain electrode 18b all of which are provided on the base coat film 11 in the stated order. The semiconductor layer 12a illustrated in FIG. 3 is shaped into an island and provided above the base coat film 11. The semiconductor layer 12a includes, for example, a channel region, a source region, and a drain region. The gate insulating film 13 illustrated in FIG. 3 is provided to cover the semiconductor layer 12a. The gate electrode 14a illustrated in FIG. 3 is provided above the gate insulating film 13 to overlap the channel region of the semiconductor layer 12a. The first interlayer insulating film 15 and the second interlayer insulating film 17 illustrated in FIG. 3 are provided in the stated order to cover the gate electrode 14a. The source electrode 18a and the drain electrode 18b illustrated in FIG. 3 are spaced apart from each other on the second interlayer insulating film 17. As illustrated in FIG. 3, the source electrode 18a and the drain electrode 18b are respectively and electrically connected to the source region and the drain region of the semiconductor layer 12a through contact holes each formed in a multilayer film including the gate insulating film 13, the first interlayer insulating film 15, and the second interlayer insulating film 17. Note that the gate insulating film 13, the first interlayer insulating film 15, and the second interlayer insulating film 17 are, for example, a monolayer inorganic insulating film made of such materials as silicon nitride, silicon oxide, and silicon oxide nitride, or a multilayer inorganic insulating film made of these materials.

As illustrated in FIG. 4, in each sub-pixel P, the second TFT 9b is electrically connected to the corresponding first TFT 9a and power source line 18g. The second TFT 9b illustrated in FIG. 3 includes: a semiconductor layer 12b; the gate insulating film 13; a gate electrode 14b; the first interlayer insulating film 15; the second interlayer insulating film 17; and a source electrode 18c and a drain electrode 18d all of which are provided on the base coat film 11 in the stated order. The semiconductor layer 12b illustrated in FIG. 3 is shaped into an island and provided above the base coat film 11. The semiconductor layer 12b includes, for example, a channel region, a source region, and a drain region. The gate insulating film 13 illustrated in FIG. 3 is provided to cover the semiconductor layer 12b. The gate electrode 14b illustrated in FIG. 3 is provided above the gate insulating film 13 to overlap the channel region of the semiconductor layer 12b. The first interlayer insulating film 15 and the second interlayer insulating film 17 illustrated in FIG. 3 are provided in the stated order to cover the gate electrode 14b. The source electrode 18c and the drain electrode 18d illustrated in FIG. 3 are spaced apart from each other on the second interlayer insulating film 17. As illustrated in FIG. 3, the source electrode 18c and the drain electrode 18d are respectively and electrically connected to the source region and the drain region of the semiconductor layer 12b through contact holes each formed in a multilayer film including the gate insulating film 13, the first interlayer insulating film 15, and the second interlayer insulating film 17.

Note that, as an example, the first TFTs 9a and the second TFTs 9b in this embodiment are top gate TFTs. Alternatively, the first TFTs 9a and the second TFTs 9b may be bottom gate TFTs.

As illustrated in FIG. 4, in each sub-pixel P, the capacitor 9c is connected to the corresponding first TFT 9a and power source line 18g. The capacitor 9c illustrated in FIG. 3 includes: a lower conductive layer 14c formed of the same material, and in the same layer, as the gate line 14 and the gate the gate electrodes 14a and 14b; the first interlayer insulating film 15 provided to cover the lower conductive layer 14c; and an upper conductive layer 16 provided on the first interlayer insulating film 15 to overlap the lower conductive layer 14c. Note that the upper conductive layer 16 illustrated in FIG. 3 is electrically connected to the power source line 18g through a contact hole formed in the second interlayer insulating film 17.

The planarization film 19, having a flat surface in the display region D, is made of such an organic resin material as polyimide resin.

The organic EL element layer 30 illustrated in FIG. 3 includes a plurality of organic EL elements 25 serving as a plurality of light-emitting elements and arranged in a matrix on the planarization film 19 in the display region D.

Each of the organic EL elements 25 illustrated in FIG. 3 includes: a first electrode 21 provided on the planarization film 19; the organic EL layer 23 provided on the first electrode 21; and a second electrode 24 provided on the organic layer 23 and lying monolithically throughout the display region D.

The first electrode 21 illustrated in FIG. 3 is electrically connected to the drain electrode 18d of the second TFT 9b in each sub-pixel P through a contact hole formed in the planarization film 19. The first electrode 21 is capable of injecting holes into the organic EL layer 23. Preferably, the first electrode 21 is formed of a material having a high work function in order to improve efficiency in injecting the holes into the organic EL layer 23. Exemplary materials of the first electrode 21 include such metal materials as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Moreover, the exemplary materials of the first electrode 21 may also include an alloy of astatine (At)/astatine dioxide ($AtO_2$). Furthermore, the exemplary materials of the first electrode 21 may include such conductive oxides as tin oxide (SnO), zinc oxide (ZnO), indium tin oxide (ITO), and indium zinc oxide (IZO). Moreover, the first electrode 21 may be a multilayer including two or more layers made of the above materials. Exemplary compound materials having a high work function include indium tin oxide (ITO) and indium zinc oxide (IZO). Furthermore, the first electrode 21 has a peripheral end covered with an edge cover 22 shaped into a grid pattern and provided throughout the display region D. Exemplary materials of the edge cover 22 include such positive photosensitive resins as polyimide resin, acrylic resin, polysiloxane resin, and novolak resin.

As illustrated in FIG. 5, the organic EL layer 23 includes: a hole-injection layer 1; a hole-transport layer 2; a light-emitting layer 3; an electron-transport layer 4; and an electron-injection layer 5 all of which are provided one after an other on the first electrode 21 in the stated order.

The hole injection layer 1, also referred to as an anode buffer layer, is capable of approximating the energy levels of the first electrode 21 and the organic EL layer 23 and of increasing efficiency in injection of the holes from the first electrode 21 to the organic EL layer 23. Exemplary materials of the hole injection layer 1 may include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole-transport layer 2 is capable of improving efficiency in transporting the holes from the first electrode 21 to the organic EL layer 23. Exemplary materials of the hole transport-layer 2 may include porphyrin derivatives, aromatic tertiary amine compounds, styryl amine derivatives, polyvinylcarbazole, poly-p-phenylene vinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region into which the holes and the electrons are injected from the first electrode 21 and the second electrode 24 and recombine with each other, when a voltage is applied with the first electrode 21 and the second electrode 24, This light-emitting layer 3 is formed of a material with high light emission efficiency. Exemplary materials of the light-emitting layer 3 may include metal oxinoid compounds [8-hydroxyquinoline metal complexes], naphthalene derivatives, anthracene derivatives, diphenylethylene derivatives, vinylacetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rodamine derivatives, acridine derivatives, phenoxazone, quinacridone derivatives, rubrene, poly-p-phenylene vinylene, and polysilane.

The electron-transport layer 4 is capable of efficiently transporting the electrons to the light-emitting layer 3. Exemplary materials of the electron-transport layer 4 may include, as organic compounds, oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds.

The electron-injection layer 5 is capable of approximating the energy levels of the second electrode 24 and the organic EL layer 23, and increasing efficiency in injection of the electrons from the second electrode 24 to the organic EL layer 23. Such a feature makes it possible to decrease a drive voltage of the organic EL element 25. The electron injection layer 5 may also be referred to as a cathode buffer layer. Exemplary materials of the electron-injection layer 5 may include: such inorganic alkaline compounds as lithium fluoride (LiF), magnesium fluoride magnesium fluoride (MgF$_2$), calcium fluoride (CaF$_2$), strontium fluoride (SrF$_2$), and barium fluoride (BaF$_2$); aluminum oxide (Al$_2$O$_3$); and strontium oxide (SrO).

As illustrated in FIG. 3, the second electrode 24 covers the edge cover 22 provided in common to the organic EL layer 23 for each sub-pixel P and all the sub-pixels P. The second electrode 24 is capable of injecting electrons into the organic EL layer 23. Preferably, the second electrode 24 is made of a material having a low work function in order to improve efficiency in injection of the electrons into the organic EL layer 23. Exemplary materials of the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF), The second electrode 24 may also be formed of an alloy of magnesium (Mg)/copper (Cu), magnesium (Mg)/silver (Ag), sodium (Na)/potassium (K), astatine (At)/astatine dioxide (AtO$_2$), lithium (Li)/aluminum (Al), lithium (Li)/calcium (Ca)/aluminum (Al), and lithium fluoride (LiF)/calcium (Ca)/aluminum (Al). The second electrode 24 may also be formed of such conductive oxides as tin oxide (SnO), zinc oxide (ZnO), indium tin oxide (ITO) and indium zinc oxide (IZO). The second electrode 24 may be a multilayer including two or more layers made of the above materials. Exemplary materials having a low work function include magnesium (Mg), lithium (Li), lithium fluoride (LiF), magnesium (Mg)/copper (Cu), magnesium(Mg)/silver (Ag), sodium (Na)/potassium (K), lithium (Li)/aluminum (Al), lithium (Li)/calcium (Ca)/aluminum (Al), and fluoride (LiF)/calcium (Ca)/aluminum (Al).

The sealing film 35 illustrated in FIG. 3 is provided above the organic EL element layer to cover each of the organic EL elements 25. As illustrated in FIG. 3, the sealing film 35 includes: a first sealing inorganic insulating film 31 provided to cover the second electrode 24; a sealing organic film 32 provided on the first sealing inorganic insulating film 31; a second inorganic insulating film 33 provided to cover the sealing organic film 32. The sealing film 35 is capable of protecting the organic EL layer 23 from such foreign objects as water and oxygen. The first inorganic insulating film 31 and the second inorganic insulating film 33 are made of such inorganic materials as silicon dioxide (SiO$_2$), aluminum oxide (Al$_2$O$_3$), silicon nitride (SiN$_x$ (where x is a positive integer)) such as trisilicon tetranitride (Si$_3$N$_4$), and silicon carbide nitride (SiCN). Exemplary materials of the sealing organic film 32 include such organic materials as acrylic resin, polyuria resin, parylene resin, polyimide resin, and polyamide resin.

Moreover, as illustrated in FIGS. 6 to 8, the frame region F of the organic EL display device 50a includes: the resin substrate layer 10; the base coat film 11 provided on the resin substrate layer 10; the gate insulating film 13; the first interlayer insulating film 15; the second interlayer insulating film 17; a first resin layer 8; a first protective layer 7a; a first routed wire 18h; and a second resin layer 19a. Note that the plan views in FIG. 6 and FIGS. 9 to 13 to be illustrated later omit the second resin layer 19a throughout the drawings.

The fold portion B of the frame region F includes a slit S formed in the base coat film 11, the gate insulating film 13, the first interlayer insulating film 15, and the second interlayer insulating film 17. As illustrated in FIGS. 6 and 7, the slit S penetrates the base coat film 11, the gate insulating film 13, the first interlayer insulating film 15, and the second interlayer insulating film 17, and exposes a top face of the resin substrate layer 10. Note that the slit S is shaped into a groove lying across the frame region F in the longitudinal direction of the fold portion B.

The first resin layer 8 illustrated in FIGS. 6 to 8 is shaped into a strip in plan view to fill the slit S. The first resin layer 8 is made of, for example, such an organic resin material as polyimide resin.

The first routed wire 18h illustrated in FIGS. 6 to 8 is provided through the first protective layer 7a above the first resin layer 8 and opposing edges of the second interlayer insulating film 17 in which the slit S is formed. The first routed wire 18h illustrated in FIG. 6 includes a plurality of first routed wires 18h extending in parallel with one an other perpendicularly to the longitudinal direction of the fold portion B. Each of the first routed wires 18h is formed of the same material as, and in the same layer as, the source line 18f, the source electrodes 18a and 18c, the drain electrodes 18b and 18d, and the power source line 18g. Moreover, as illustrated in FIGS. 6 and 7, each of the first routed wires 18h has an end, toward the display region D, electrically connected to a first gate conductive layer 14c through a first contact hole Ha formed in a multilayer film of the first interlayer insulating film 15 and the second interlayer insulating film 17. The first gate conductive layer 14c illustrated in FIGS. 6 and 7 includes a plurality of first gate conductive layers 14c each serving as a first led wire. The first gate conductive layers 14c are provided between the gate insulating film 13 and the first interlayer insulating film 15, and extend in parallel with one an other perpendicularly to the longitudinal direction of the fold portion B. The first gate conductive layers 14c are electrically connected to display wires (e.g. the source wires 18f) in the TFT layer 20 of the display region D. Moreover, as illustrated in FIGS. 6 and 7, each of the first routed wires 18h has an end, toward the terminal unit T, electrically connected to a second gate conductive layer 14d through a second contact hole Hb formed in a multilayer film of the first interlayer insulating film 15 and the second interlayer insulating film 17. The second gate conductive layer 14d illustrated in FIGS. 6 and 7 includes a plurality of second gate conductive layers 14d each serving as a second led wire. The second gate conductive layers 14d are provided between the gate insulating film 13 and the first interlayer insulating film 15, and extending in parallel with one an other perpendicularly to the longitudinal direction of the fold portion B. The second gate conductive layers 14d are electrically connected to the terminals 18t of the terminal unit T. In this embodiment, the first gate conductive layer 14c and the second gate conductive layer 14d are described as an example of the first led wire and the second lead wire. Alternatively, the first led wire and the second led wire may be a capacitor conductive layer formed of the same material, and in the same layer, as the upper conductive layer 16 included in the capacitor 9c. Moreover, one of the first led wire or the second lead wire may be formed of the first gate conductive layer 14c or the second gate conductive layer 14d. An other one of the first led wire or the second led wire may be formed of the capacitor conductive layer (i.e. a first capacitor conductive layer 16c or a second capacitor conductive layer 16d of a second embodiment to be described later).

Exemplary materials of the first gate conductive layer 14c and the second gate conductive layer 14d may include: a monolayer metal film containing at least one of such materials as aluminum (Al), tungsten (W), molybdenum (Mo), molybdenum nitride (MoN), tantalum (Ta), chromium (Cr), titanium (Ti), and copper (Cu); or a multilayer metal film (e.g. a multilayer film such as Ti/Al/Ti, Mo/Al, Mo/Al/Mo, MoN/Al, MoN/Al/MoN, and Cu/Ti).

Exemplary materials of the capacitor conductive layer may include: a monolayer metal film containing at least one of such materials as aluminum (Al), tungsten (W), molybdenum (Mo), molybdenum nitride (MoN), tantalum (Ta), chromium (Cr), titanium (Ti), and copper (Cu); or a multilayer metal film (e.g. a multilayer film such as Ti/Al/Ti, Mo/Al, Mo/Al/Mo, MoN/Al, MoN/Al/MoN, and Cu/Ti).

Note that, preferably, the first gate conductive layer 14c, the second gate conductive layer 14d, and the capacitor conductive layer are made of the same material and in the same structure. For example, if the first gate conductive layer 14c has a stacked structure of Mo/Al (i.e. a stacked structure including an upper layer formed of Mo and a lower layer formed of Al), the capacitor conductive layer also preferably has the stacked structure of Mo/Al. Such a stacked structure makes it possible to equalize electrical resistance between the first led wire formed of the first gate conductive layer 14c and the second led wire formed of the capacitor conductive layer.

As illustrated in FIGS. 6 to 8, the first protective layer 7a (dotted areas in FIG. 6) is formed between, and in contact with, the first resin layer 8 and the first routed wires 18h, and provided to at least partially coincide with each of the first routed wires 18h. Moreover, the first protective layer 7a illustrated in FIGS. 6 and 7 includes a plurality of first protective layers 7a shaped into a plurality of islands and arranged in the longitudinal direction of the first routed wires 18h. Furthermore, as illustrated in FIGS. 6 and 8, the islands of the first protective layers 7a are provided to match transversely opposing ends of each of the first routed wires 18h. Note that, in Description, the term "match" means not only a case where side faces of two target layers vertically flush with each other. The meaning of the term "match" is not limited to the case where the side faces of the two target layers precisely match each other, including a case where the side faces are, for example, continuously tapered to form an angled face. The case includes a misalignment of approximately 2 to 3 μm between the side faces, which is caused by a difference due to etching rate when, for example, the first routed wires 18h are formed by wet-etching and, simultaneously, the first protective layers 7a are formed by dry-etching. Such a typical structure of the side faces is formed, for example, by etching with the same resist pattern. Here, the first protective layers 7a are, for example, inorganic insulating films made of such a material as silicon oxide.

As illustrated in FIGS. 7 and 8, the second resin layer 19a is provided to cover the first routed wires 18h. Here, the second resin layer 19a is, for example, formed in the same layer, and of the same material, as the planarization film 19 is.

Note that illustrated in this embodiment as an example is the organic EL display device 50a provided with the first protective layers 7a shaped planarly as illustrated in FIG. 6. Instead of the first protective layers 7a, first protective layers 7b to 7f shaped planarly as illustrated in FIGS. 9 to 13 may be included in organic EL display devices 50aa to 50ae. FIGS. 9 to 13 are plan views illustrating the frame region F of the organic EL display devices 50aa to 50ae that are first to fifth modifications of the organic EL display device 50a.

Figure 9:
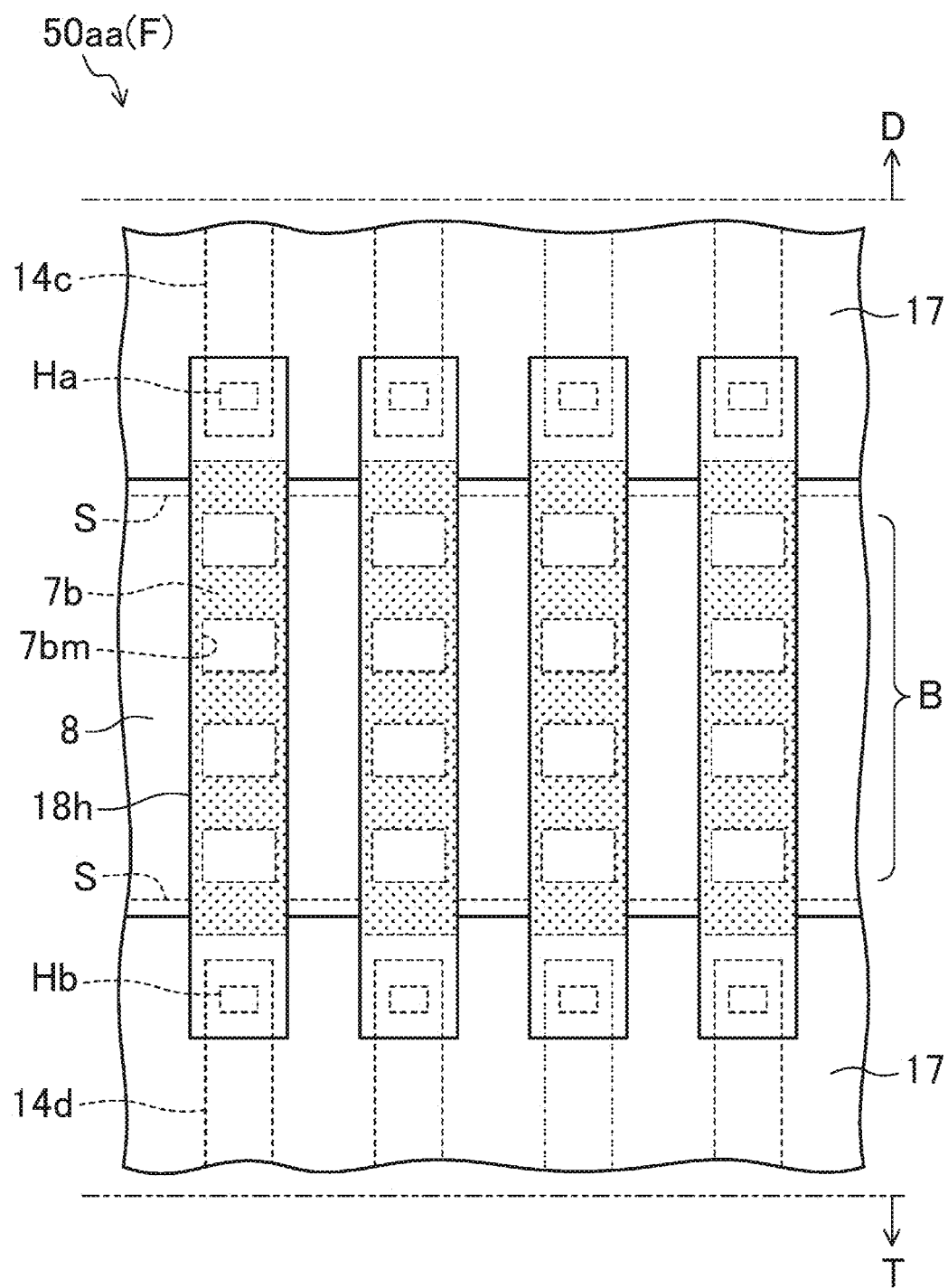
FIG. 9 is a plan view illustrating the frame region in a first modification of the organic EL display device according to the first embodiment of the disclosure.

The frame region F of the organic EL display device 50aa illustrated in FIG. 9 includes the first protective layers 7b (dotted areas in the drawing) each shaped into a strip. Here, as illustrated in FIG. 9, the first protective layers 7b are provided to match transversely opposing ends of the first routed wires 18h. Moreover, each of the first protective layers 7b illustrated in FIG. 9 includes a plurality of protective-layer openings 7bm arranged in the longitudinal direction of the first routed wires 18h and penetrating the first protective layer 7b. Thanks to such a feature, the surface of the first resin layer 8 exposed from the protective-layer openings 7bm is covered with the first routed wires 18h. Hence, the feature keeps the surface of the first resin layer 8 from having contact with chlorine-based gas to be used for patterning the first routed wires 18h, making it possible to reliably reduce the risk of contamination inside a chamber of a dry-etching apparatus.

Figure 10:
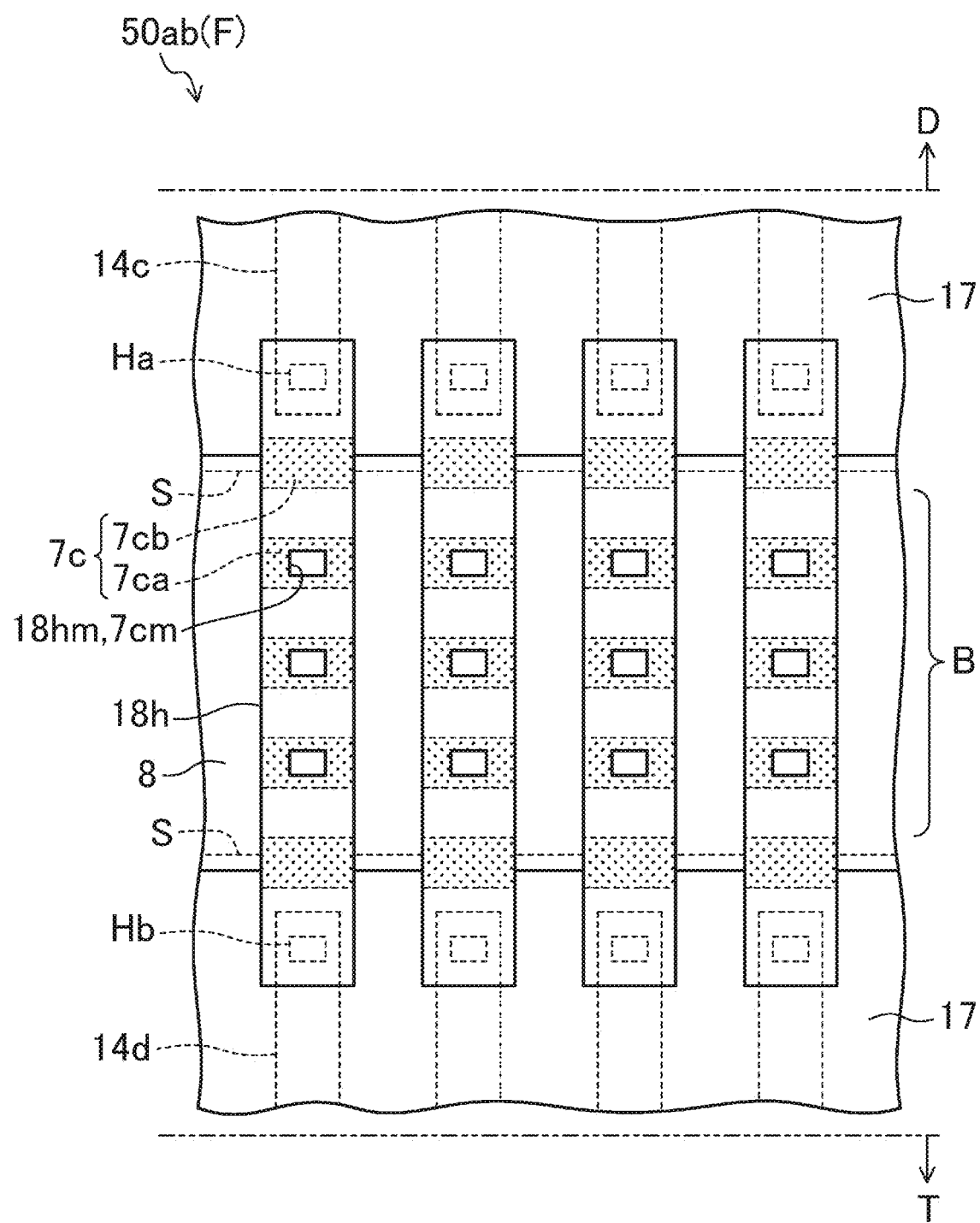
FIG. 10 is a plan view illustrating the frame region in a second modification of the organic EL display device according to the first embodiment of the disclosure.

The frame region F of the organic EL display device 50ab illustrated in FIG. 10 includes first protective layers 7c (dotted areas in the drawing) shaped into islands. Here, in the fold portion B, each of the first routed wires 18h illustrated in FIG. 10 includes a plurality of wire openings 18hm arranged in the longitudinal direction of, and penetrating, the first routed wire 18h. The first protective layers 7c illustrated in FIG. 10 include first protective layers 7*ca* provided to the fold portion B and first protective layers 7*cb* provided out of the fold portion B. Each of the first protective layers 7*ca* illustrated in FIG. 10 includes a corresponding one of a plurality of protective-layer openings 7*cm* penetrating the first protective layer 7*ca* to match a corresponding one of the wire openings 18*hm*. The first protective layers 7*ca* and 7*cb* illustrated in FIG. 10 are provided to match transversely opposing ends of the first routed wires 18*h*. Thanks to such a feature, each of the first routed wires 18*h* includes the wire openings 18*hm*. When the organic EL display device 50*ab* is folded at the fold portion B, the feature makes it possible to disperse the stress on the first routed wires 18*h* and to reduce the risk of the first routed wires 18*h* to be broken.

Figure 11:
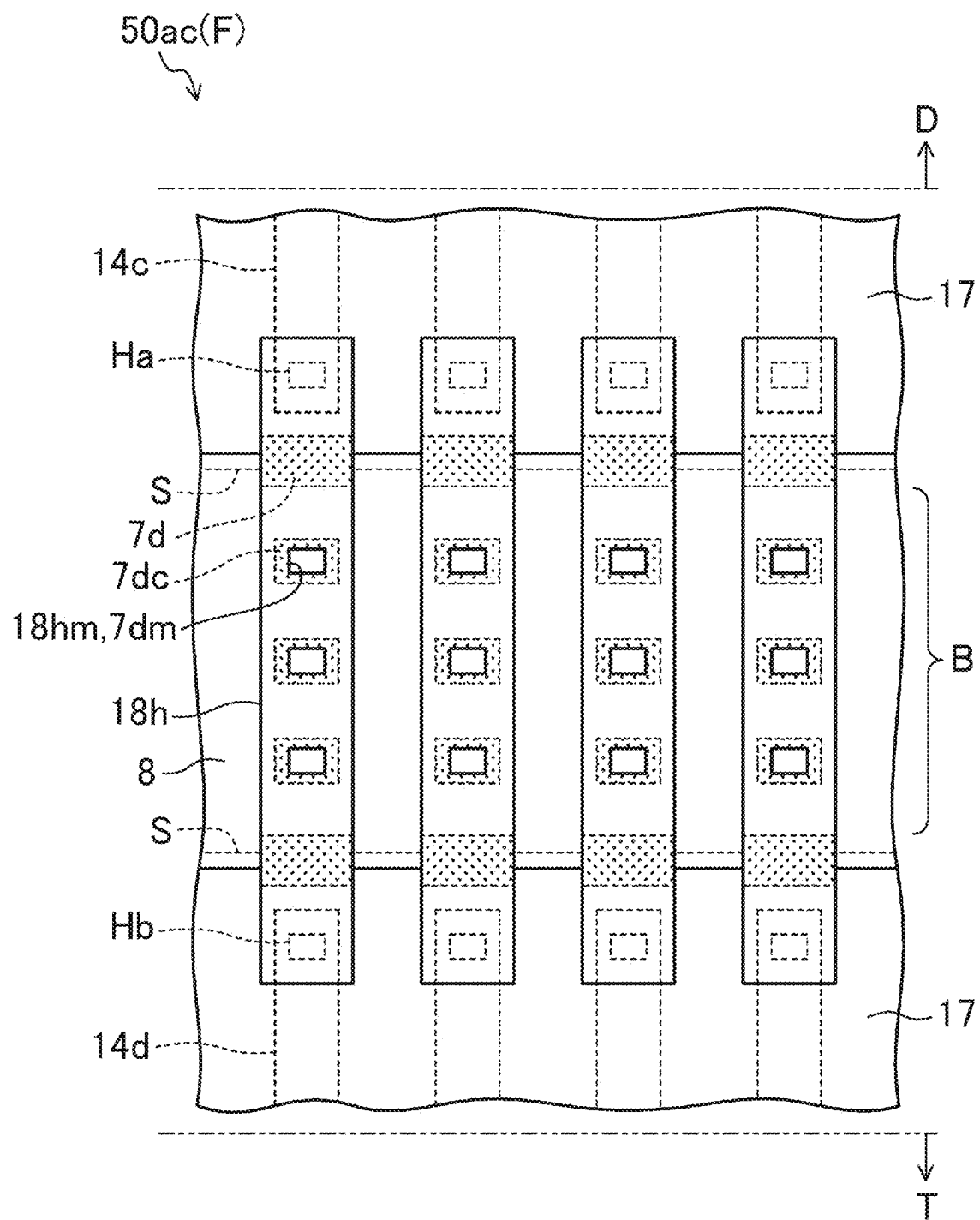
FIG. 11 is a plan view illustrating the frame region in a third modification of the organic EL display device according to the first embodiment of the disclosure.

The frame region F of the organic EL display device 50*ac* illustrated in FIG. 11 includes the first protective layers 7*d* (dotted areas in the drawing) shaped into islands and provided to longitudinally opposing ends of each of the first routed wires 18*h* to overlap an end of the first resin layer 8. Here, in the fold portion B, each of the first routed wires 18*h* illustrated in FIG. 11 includes the wire openings 18*hm* arranged in the longitudinal direction of, and penetrating, the first routed wire 18*h*. Moreover, as illustrated in FIG. 11, each of the first routed wires 18*h* has a longitudinal center including a plurality of first island layers 7*dc* formed of the same material, and in the same layer, as the first protective layers 7*d*. As illustrated in FIG. 11, each of the first island layers 7*dc* includes an opening 7*dm* penetrating the first island layer 7*dc* to match a corresponding one of the wire openings 18*hm*. The first island layers 7*dc* illustrated in FIG. 11 are included in a transverse center of each of the first routed wires 18*h*, so that the first routed wire 18*h* and the first resin layer 8 come into contact with each other at transversely opposing ends of the first routed wire 18*h*. The first protective layers 7*d* illustrated in FIG. 11 are provided to match transversely opposing ends of the first routed wires 18*h*. Thanks to such a feature, each of the first routed wires 18*h* includes the wire openings 18*hm*. When the organic EL display device 50*ac* is folded at the fold portion B, the feature makes it possible to disperse the stress on the first routed wires 18*h* and to reduce the risk of the first routed wires 18*h* to be broken.

Figure 12:
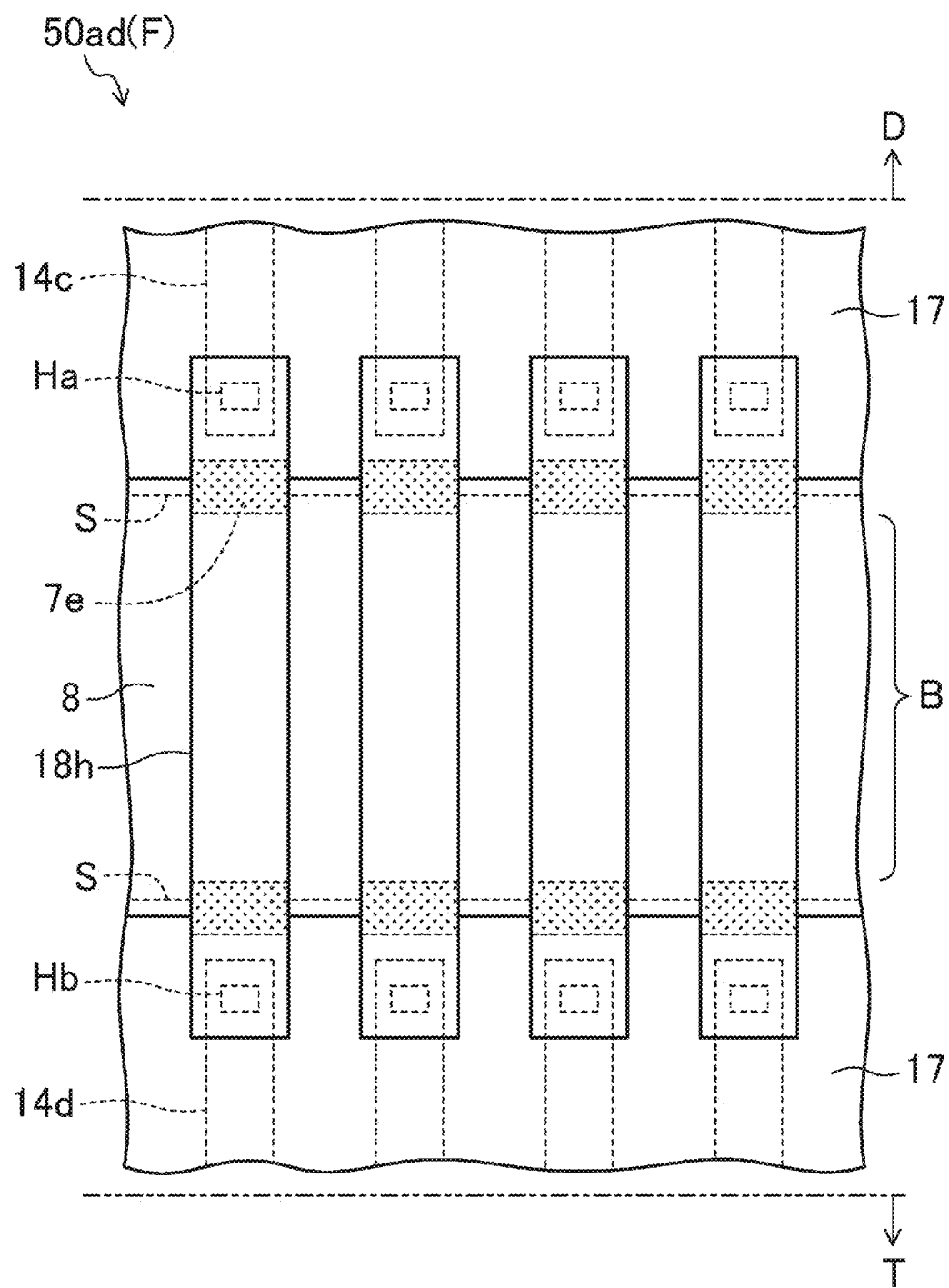
FIG. 12 is a plan view illustrating the frame region in a fourth modification of the organic EL display device according to the first embodiment of the disclosure.
Figure 13:
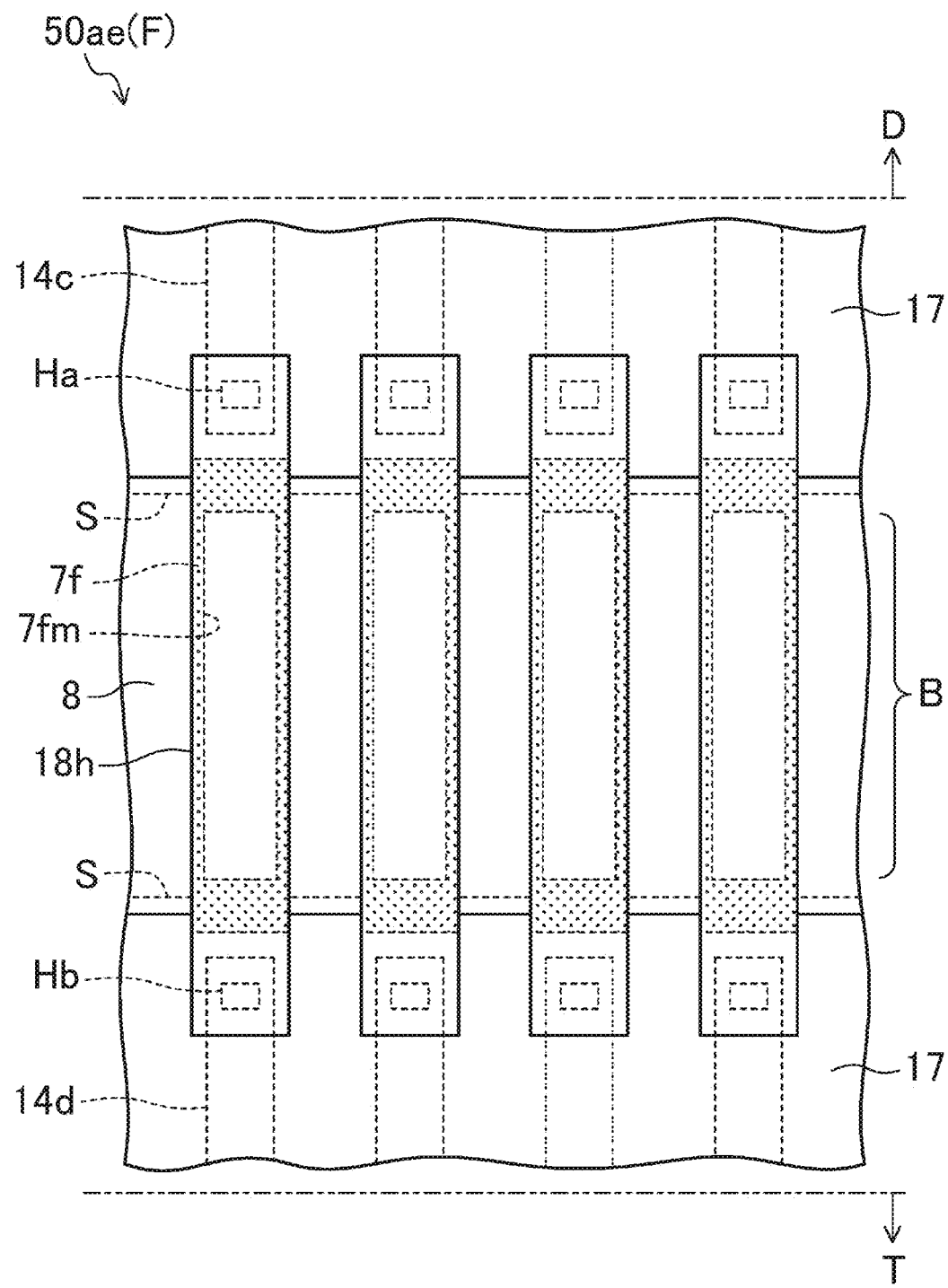
FIG. 13 is a plan view illustrating the frame region in a fifth modification of the organic EL display device according to the first embodiment of the disclosure.

The frame region F of the organic EL display device 50*ad* illustrated in FIG. 12 includes the first protective layers 7*e* (dotted areas in the drawing) arranged between the first contact hole Ha and the second contact hole Hb of each of the first routed wires 18*h*, and provided at longitudinally opposing ends of the first routed wire 18*h*. Here, as illustrated in FIG. 12, the first protective layers 7*e* are provided to match transversely opposing ends of each of the first routed wires 18*h*. Thanks to such a feature, the fold portion B does not include the first protective layers 7*e*. The feature makes it possible to reduce the risk of a crack opening on an inorganic insulating film when the organic EL display device 50*ad* is folded at the fold portion B, and to reduce the risk of the first routed wires 18*h* to be broken The frame region F of the organic EL display device 50*ae* illustrated in FIG. 13 includes the first protective layers 7*f* (dotted areas in the drawing) each disposed between the first contact hole Ha and the second contact hole Hb of one of the first routed wires 18*h*, and connecting together the longitudinally opposing ends of the one first routed wire 18*h*. Here, as illustrated in FIG. 13, each of the first protective layers 7*f* includes in the fold portion B a protective-layer opening 7*fm* penetrating the first protective layer 7*f*. Moreover, the first protective layers 7*f* illustrated in FIG. 13 are provided to match transversely opposing ends of the first routed wires 18*h*. Thanks to such a feature, the surface of the first resin layer 8 exposed from the protective-layer openings 7*fm* is covered with the first routed wires 18*h*. Hence, the feature keeps the surface of the first resin layer 8 from having contact with chlorine-based gas to be used for patterning of the first routed wires 18*h*, making it possible to reliably reduce the risk of contamination inside a chamber of a dry-etching apparatus.

The above organic EL display device 50*a* displays an image as follows: In each sub-pixel P, a gate signal is input through the gate line 14 to the first TFT 9*a*. The first TFT 9*a* turns ON. Through the source line 18*f*, a voltage corresponding to a source signal is written the gate electrode 14*b* of the second TFT 9*b* and the capacitor 9*c*. A current is defined in accordance with the gate voltage of the second TFT 9*b*, and supplied from the power source line 18*g* to the organic EL layer 23. The supplied current allows the light-emitting layer 3 of the organic EL layer 23 to emit light, and the image is displayed. Note that, in the organic EL display device 50*a*, even if the first TFT 9*a* turns OFF, the gate voltage of the second TFT 9*b* is held in the capacitor 9*c*. Hence, the light-emitting layer 3 keeps emitting light until a gate signal of the next frame is input.

Figure 14:
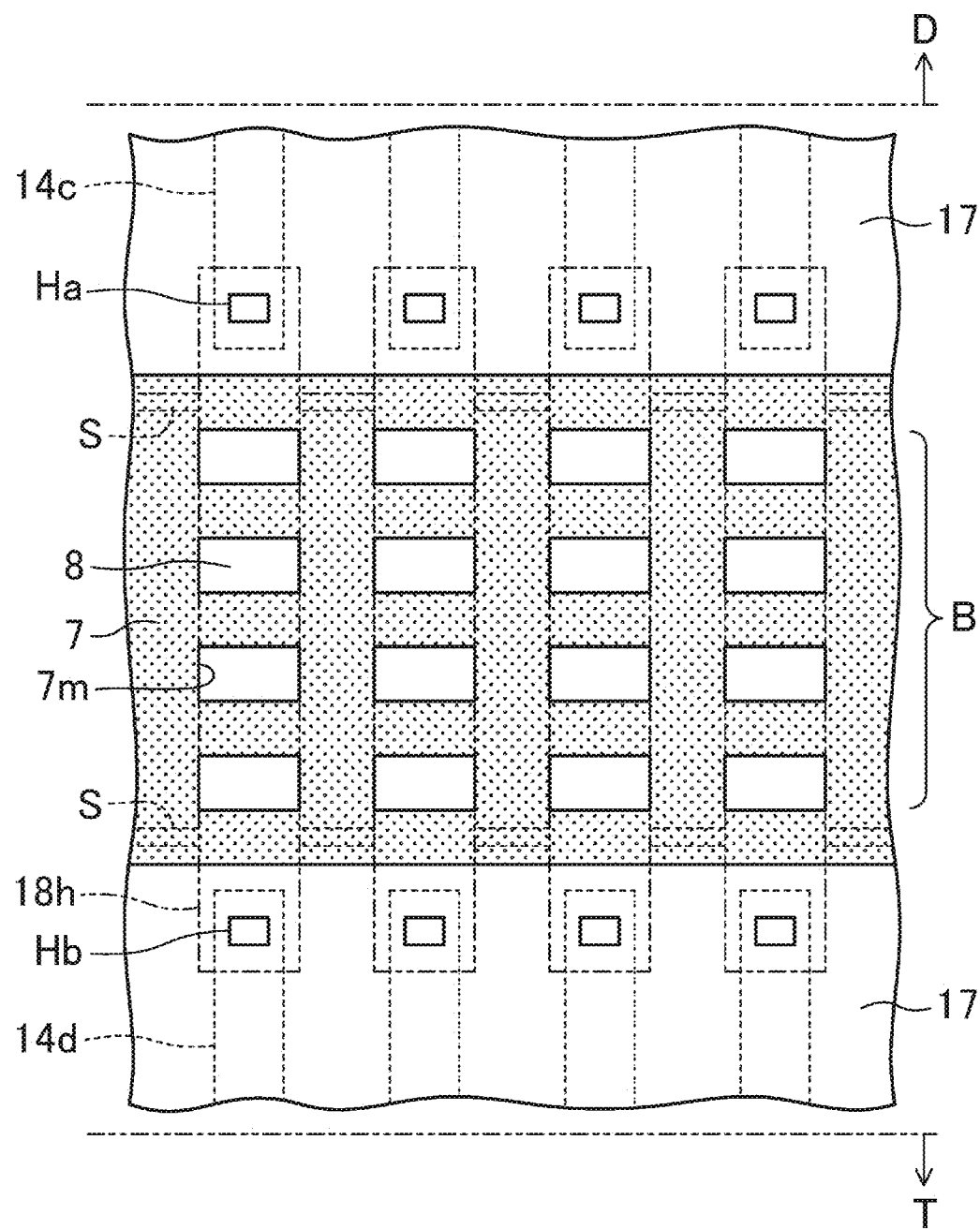
FIG. 14 is a plan view illustrating the frame region in a step of producing the organic EL display device according to the first embodiment of the disclosure.

Described next is a method for producing the organic EL display device 50*a* of this embodiment, with reference to FIG. 14. Note that the method for producing the organic EL display device 50*a* of this embodiment includes: forming TFT layer; forming organic EL element layer; and forming sealing film. FIG. 14 is a plan view illustrating the frame region F in one of the steps in the forming TFT layer for producing the organic EL display device 50*a*. Note that, in FIG. 14, chain double-dashed lines denoted with the reference sign 18*h* are phantom lines illustrating the first routed wires 18*h*.

Forming TFT Layer

On a surface of the resin substrate layer 10 formed on a glass substrate, for example, the base coat film 11, the first TFTs 9*a*, the second TFTs 9*b*, the capacitors 9*c*, and the planarization film 19 are formed with a known technique to form the TFT layer 20.

Here, in forming the first TFTs 9*a* and the second TFTs 9*b*, first, the slit S is formed prior to forming, for example, the source electrode 18*a*. In the fold portion B of the frame region F, the base coat film 11, the gate insulating film 13, the first interlayer insulating film 15, and the second interlayer insulating film 17 are dry-etched so that the slit S is formed to expose the surface of the resin substrate layer 10.

Next, by, for example, ink-jet printing, an organic resin material such as polyimide resin is charged into the slit S so that the first resin layer 8 is formed to fill the slit S.

Furthermore, an inorganic insulating film such as a silicon oxide film is deposited by the plasma chemical vapor deposition (CVD) to cover the first resin layer 8. The deposited inorganic insulating film is patterned to form a protective film 7 as illustrated in FIG. 14. Here, the protective film 7 illustrated in FIG. 14 includes a plurality of openings 7*m* formed in a matrix to penetrate the protective film 7 and expose the first resin layer 8. A comparison between FIGS. 6 and 14 shows that the openings 7*m* are provided to separate the first protective layers 7*a*, arranged vertically in the drawings, from one an other. In this embodiment and the first to fifth modifications, the first protective layers 7*a* to 7*e* are provided between the first contact holes Ha and the second contact holes Hb. Alternatively, for example, the protective film 7 may be formed into strips only between the regions in which the first routed wires 18h are formed, such that none of the first protective layers 7a to 7e may be formed between the first contact holes Ha and the second contact holes Hb.

After that, a metal multilayer film is deposited by, for example, sputtering to cover the protective film 7. On the deposited metal multilayer film, a resist pattern is formed. The metal multilayer film exposing from the resist pattern is removed by dry-etching using chlorine-based gas, so that the first routed wires 18h are formed together with, for example, the source electrode 18a. Exemplary materials of the first routed wires 18h may include: a monolayer metal film containing at least one of such materials as aluminum (Al), tungsten (W), molybdenum (Mo), molybdenum nitride (MoN), tantalum (Ta), chromium (Cr), titanium (Ti), and copper (Cu); or a multilayer metal film (e.g. a multilayer film such as Ti/Al/Ti, Mo/Al, Mo/Al/Mo, MoN/Al, MoN/Al/MoN, and Cu/Ti).

Furthermore, the protective film 7 exposed from the first routed wires 18h is removed by dry-etching using fluorine-based gas, so that the protective layers 7a are formed. After that, the planarization film 19 and the second resin layer 19a are formed.

Forming Organic EL Element Layer

On the planarization film 19 of the TFT layer 20 formed in the forming TFT layer, the first electrode 21, the edge cover 22, the organic EL layer 23 (including the hole-injection layer 1, the hole-transport layer 2, the light-emitting layer 3, the electron-transport layer 4, and the electron-injection layer 5), and the second electrode 24 are formed with a known technique to form the organic EL elements 25. Hence, the organic EL element layer 30 is formed, Forming Sealing Film On the organic EL element layer 30 formed in the above forming organic EL element layer, an inorganic insulating film such as a silicon nitride film, a silicon oxide film, or a silicon nitride oxide film is deposited by, for example, the plasma chemical vapor deposition (CVD) using a mask to cover the organic EL elements 25. The deposited inorganic insulating film forms the first sealing inorganic insulating film 31.

Next, on the first sealing inorganic insulating film 31, an organic resin material such as acrylic resin is applied by, for example, ink-jet printing to form the sealing organic film 32.

After that, an inorganic insulating film such as a silicon nitride film, a silicon oxide film, or a silicon nitride oxide film is deposited to cover the sealing organic film 32 by the plasma CVD using a mask. The deposited inorganic insulating film forms the second sealing inorganic insulating film 33. Hence, the sealing film 35 is finalized.

Finally, on a surface of a substrate including the sealing film 35, a not-shown protective sheet is attached. After that, a laser beam is emitted on a glass substrate of the resin substrate layer 10 to remove the glass substrate from the bottom face of the resin substrate layer 10. Furthermore, on the bottom face of the resin substrate layer 10 with the glass substrate removed, a not-shown protective sheet is attached.

Through the above steps, the organic EL display device 50a of this embodiment can be produced.

As can be seen, the organic EL display device 50a according to this embodiment includes the first protective layer 7a formed between, and in contact with, the first resin layer 8 and the first routed wires 18h, and provided to at least partially coincide with each of the first routed wires 18h. The first protective layer 7a includes a plurality of first protective layers 7a provided to match transversely opposing ends of each of the first routed wires 18h. Each of the first protective layers 7a is formed by etching with a resist pattern as a mask for forming the first routed wires 18h. Hence, in forming the first routed wires 18h by dry-etching using chlorine-based gas, the surface of the first resin layer 8 is covered with the protective film 7. After that, using fluorine-based gas, the protective film 7 between the neighboring first routed wires 18h is removed by dry-etching so that the first protective layers 7a are formed. Consequently, between the neighboring first routed wires 18h, the surface of the first resin layer 8 is exposed. Such a feature keeps the first resin layer 8 and the chlorine-based gas from coming into contact with each other inside a chamber of a dry-etching apparatus, making it possible to reduce the risk of contamination inside the chamber of the dry-etching apparatus.

Moreover, in the organic EL display device 50a according to this embodiment, the first protective layers 7a are shaped into a plurality of islands arranged in a longitudinal direction of the first routed wires 18h. Hence, even if the organic EL display device 50a is folded at the fold portion B, the first protective layers 7a are less likely to have a crack, making it possible to reduce the risk of the first routed wires 18h to be broken.

Second Embodiment

Figure 15:
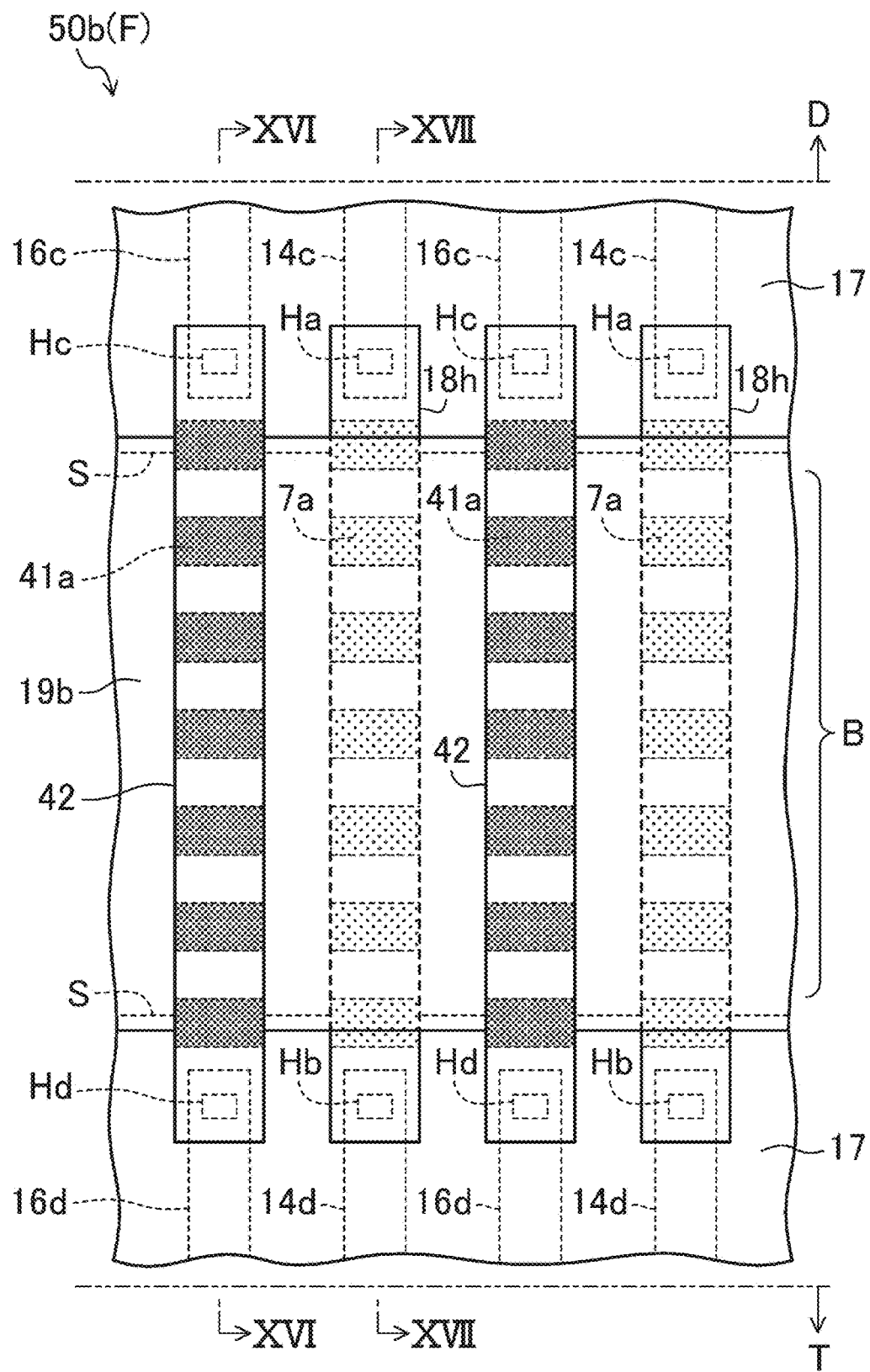
FIG. 15 is a plan view illustrating the frame region of an organic EL display device according to a second embodiment of the disclosure.
Figure 16:
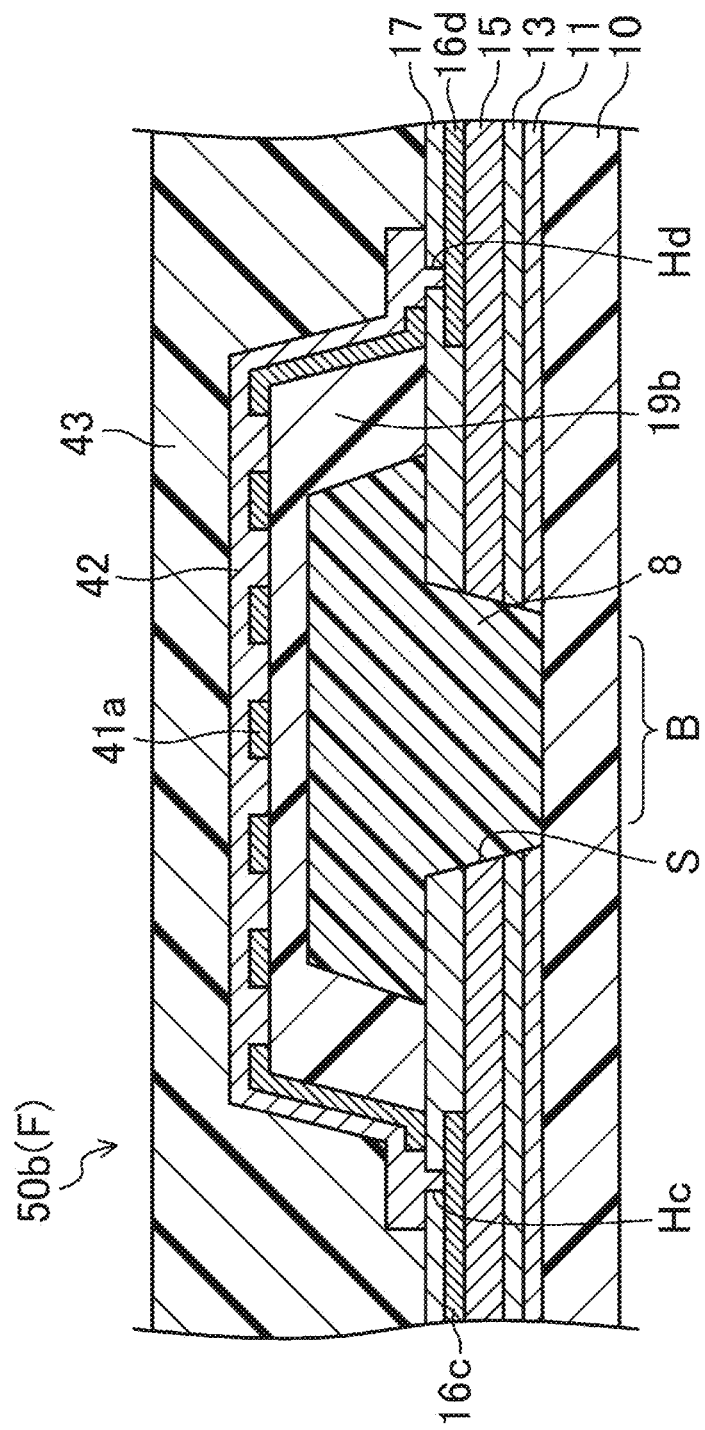
FIG. 16 is a cross-sectional view of the frame region included in the organic EL display device, the cross-sectional view being taken from line XVI-XVI in FIG. 15.
Figure 17:
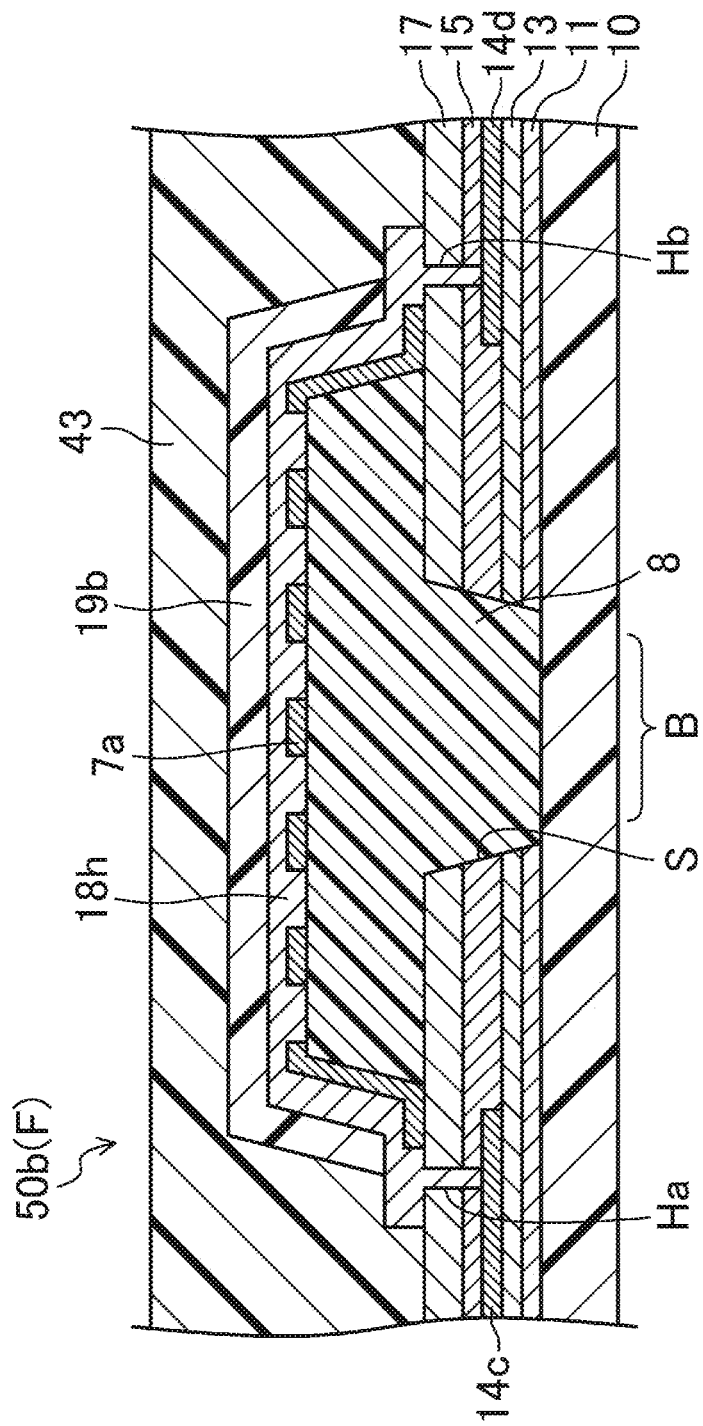
FIG. 17 is a cross-sectional view of the frame region included in the organic EL display device, the cross-sectional view being taken from line XVII-XVII in FIG. 15.

FIGS. 15 to 22 illustrate a second embodiment of a display device according to the disclosure. FIG. 15 is a plan view illustrating the frame region of an organic EL display device 50b according to this embodiment. FIGS. 16 and 17 are cross-sectional views of the frame region F included in the organic EL display device 50b, the cross-sectional views being taken from line XVI-XVI and line XVII-XVII in FIG. 15. Note that, in the embodiments below, like reference signs designate identical or corresponding components in FIGS. 1 to 14. These components will not be elaborated upon.

The first embodiment describes as an example the organic EL display device 50a in which the first routed wires 18h are provided above the first resin layer 8. Alternatively, this embodiment describes as an example the organic EL display device 50b in which the first routed wires 18h are provided above the first resin layer 8, and a second routed wire 42 is provided above a second resin layer 19b covering the first resin layer 8.

Similar to the organic EL display device 50a of the first embodiment, the organic EL display device 50b includes: the display area D; and the frame area F provided around the display area D.

Similar to the organic EL display device 50a of the first embodiment, the display region D of the organic EL display device 50b includes: the resin substrate layer 10; the TFT layer 20 provided on the resin substrate layer 10; the organic EL element layer 30 provided on the TFT layer 20; and the sealing film 35 provided on the organic EL element layer 30.

Moreover, as illustrated in FIGS. 15 to 17, the frame region F of the organic EL display device 50b includes: the resin substrate layer 10; the base coat film 11 provided on the resin substrate layer 10; the gate insulating film 13; the first interlayer insulating film 15; the second interlayer insulating film 17; the first resin layer 8; the first protective layers 7a; the first routed wires 18h; the second resin layer 19b; a second protective layer 41a; the second routed wire 42; and a third resin layer 43. Note that the plan views in FIG. 15 and FIGS. 18 to 22 to be illustrated later omit the third resin layer 43 throughout the drawings. Furthermore, in FIG. 15, the first protective layers 7a are dotted relatively coarsely, and the second protective layer 41a is dotted relatively densely.

Similar to the organic EL display device 50a of the first embodiment, the fold portion B of the frame region F includes the slit S formed in the base coat film 11, the gate insulating film 13, the first interlayer insulating film 15, and the second interlayer insulating film 17. The slit S penetrates the base coat film 11, the gate insulating film 13, the first interlayer insulating film 15, and the second interlayer insulating film 17, and exposes a top face of the resin substrate layer 10.

As illustrated in FIGS. 16 and 17, the second resin layer 19b is shaped into strips in plan view to cover the first resin layer 8 and the first routed wires 18h on the first resin layer 8. Here, the second resin layer 19b is, for example, formed in the same layer, and of the same material, as the planarization film 19 is.

The second routed wire 42 illustrated in FIGS. 15 and 16 is provided through the second protective layer 41a above the second resin layer 19b and opposing edges of the second interlayer insulating film 17 in which the slit S is formed. The second routed wire 42 illustrated in FIG. 15 includes a plurality of second routed wires 42 extending in parallel with one an other perpendicularly to the longitudinal direction of the fold portion B. Note that, as illustrated in FIG. 15, the second routed wires 42 and the first routed wires 18h are alternately arranged in plan view in the longitudinal direction (the horizontal direction in the drawing) of the fold portion B. This embodiment describes an example of the second routed wires 42 and the first routed wires 18h arranged not to overlap one an other in plan view. Alternatively, the second routed wires 42 and the first routed wires 18h may be arranged to overlap one an other in plan view. Each of the second routed wires 42 is formed of the same material as, and in the same layer as, the source line 18f, the source electrodes 18a and 18c, the drain electrodes 18b and 18d, and the power source line 18g. For example, if the source line 18f has a stacked structure of Ti/Al/Ti, the second routed wire 42 also preferably has the stacked structure of Ti/Al/Ti. Such a stacked structure makes it possible to equalize electrical resistance between the first routed wires 18h and the second routed wires 42. Moreover, as illustrated in FIGS. 15 and 16, each of the second routed wires 42 has an end, toward the display region D, electrically connected to a first capacitor conductive layer 16c through a third contact hole Hc formed in the second interlayer insulating film 17. The first capacitor conductive layer 16c illustrated in FIGS. 15 and 16 includes a plurality of first capacitor conductive layers 16c each serving as a third led wire. The first capacitor conductive layers 16c are provided between the first interlayer insulating film 15 and the second interlayer insulating film 17, and extend in parallel with one an other perpendicularly to the longitudinal direction of the fold portion B. The first capacitor conductive layers 16c are electrically connected to display wires (e.g. the source wires 18f) in the TFT layer 20 of the display region D. Moreover, as illustrated in FIGS. 15 and 16, each of the second routed wires 42 has an end, toward the terminal unit T, electrically connected to a second capacitor conductive layer 16d through a fourth contact hole Hd formed in the second interlayer insulating film 17. The second capacitor conductive layer 16d illustrated in FIGS. 15 and 16 includes a plurality of second capacitor conductive layers 16d each serving as a fourth led wire. The second capacitor conductive layers 16d are provided between the first interlayer insulating film 15 and the second interlayer insulating film 17, and extending in parallel with one an other perpendicularly to the longitudinal direction of the fold portion B. The second capacitor conductive layers 16d are electrically connected to the terminals 18t of the terminal unit T. In this embodiment, the first gate conductive layer 14c and the second gate conductive layer 14d are described as an example of the first led wire and the second lead wire, and the first capacitor conductive layer 16c and the second capacitor conductive layer 16d are described as an example of the third led wire and the fourth led wire. Alternatively, the first led wire and the second led wire may be a capacitor conductive layer, and the third led wire and the fourth led wire may be a gate conductive layer.

As illustrated in FIGS. 15 and 16, the second protective layer 41a (relatively densely dotted areas in FIG. 15) is formed between, and in contact with, the second resin layer 19b and the second routed wires 32, and provided to at least partially coincide with each of the second first routed wires 42. Moreover, the second protective layer 41a illustrated in FIGS. 15 and 16 includes a plurality of second protective layers 41a shaped into a plurality of islands and arranged in the longitudinal direction of the second routed wires 42. Furthermore, as illustrated in FIG. 15, the islands of the second protective layers 41a are provided to match transversely opposing ends of each of the second routed wires 42. Here, the second protective layers 41a are, for example, inorganic insulating films made of such a material as silicon oxide.

As illustrated in FIG. 16, the third resin layer 43 is provided to cover the second routed wires 42. The third resin layer 43 is made of, for example, such an organic resin material as polyimide resin.

Note that illustrated in this embodiment as an example is the organic EL display device 50b provided with the second protective layers 41a shaped planarly as illustrated in FIG. 15. Instead of the second protective layers 41a, second protective layers 41b to 41f shaped planarly as illustrated in FIGS. 18 to 22 may be included in organic EL display devices 50ba to 50be, FIGS. 18 to 22 are plan views illustrating the frame region F of the organic EL display devices 50ba to 50be that are first to fifth modifications of the organic EL display device 50b.

Figure 18:
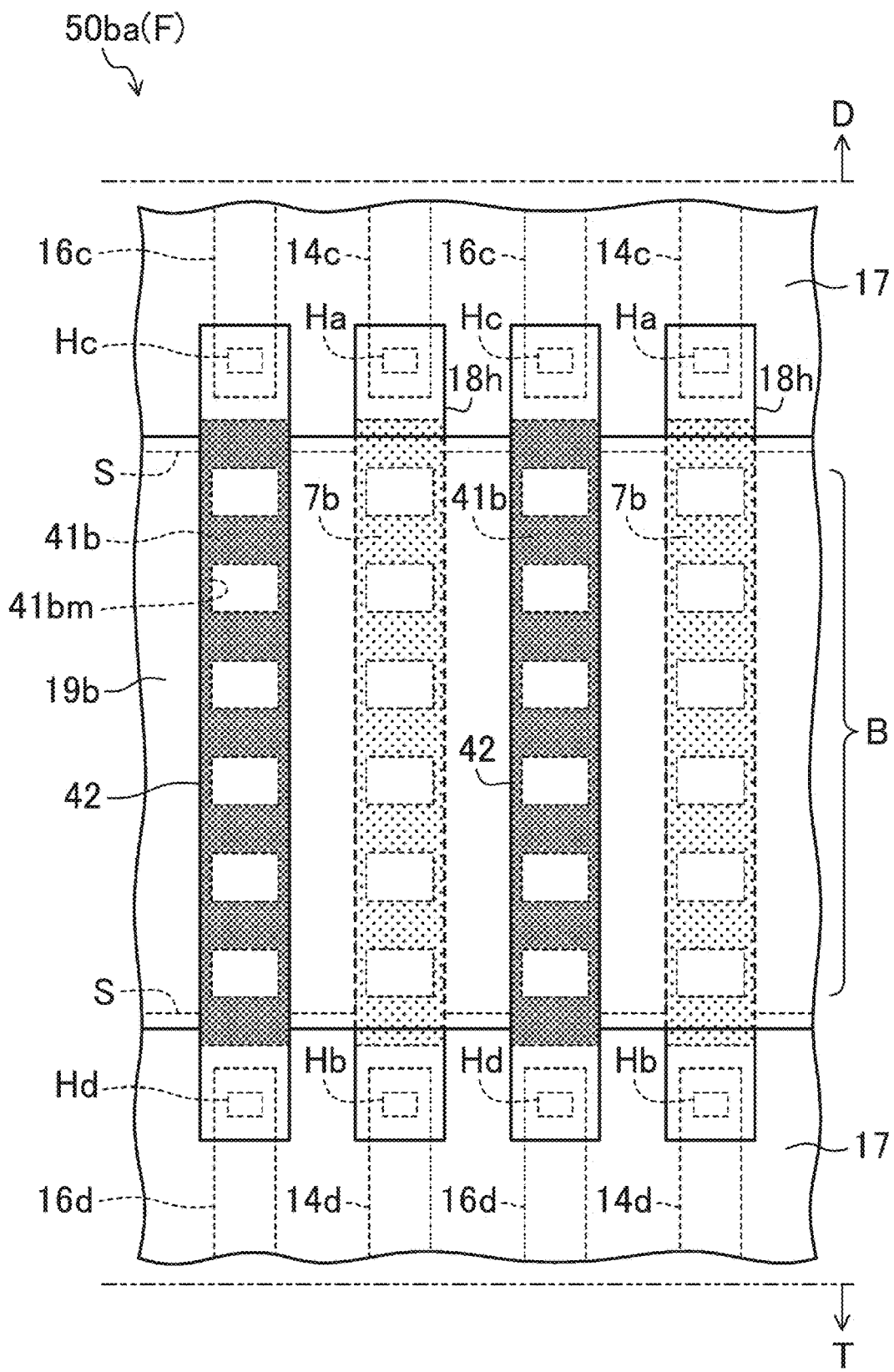
FIG. 18 is a plan view illustrating the frame region in a first modification of the organic EL display device according to the second embodiment of the disclosure.

The frame region of the organic EL display device 50ba illustrated in FIG. 18 includes the second protective layers 41b (relatively densely dotted areas in the drawing) each shaped into a strip. Here, as illustrated in FIG. 18, the second protective layers 41b are provided to match transversely opposing ends of the second routed wires 42. Moreover, each of the second protective layers 41b illustrated in FIG. 18 includes a plurality of protective-layer openings 41bm arranged in the longitudinal direction of the second routed wires 42 and penetrating the second protective layer 41b. Thanks to such a feature, the surface of the second resin layer 19b exposed from the protective-layer openings 41bm is covered with the second routed wires 42. Hence, the feature keeps the surface of the second resin layer 19b from having contact with chlorine gas to be used for patterning of the second routed wires 42, making it possible to reliably reduce the risk of contamination inside a chamber of a dry-etching apparatus.

Figure 19:
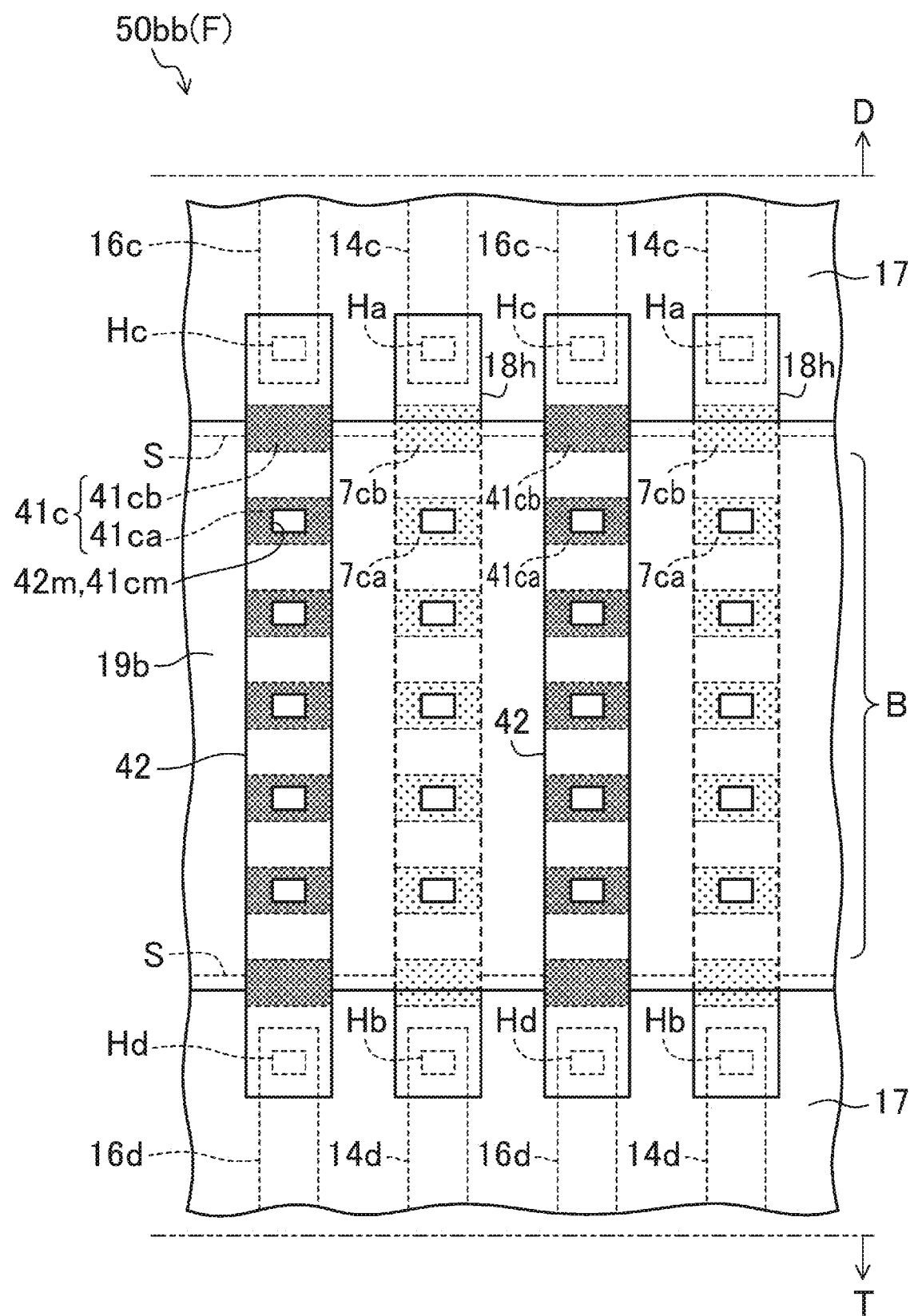
FIG. 19 is a plan view illustrating the frame region in a second modification of the organic EL display device according to the second embodiment of the disclosure.

The frame region F of the organic EL display device 50bb illustrated in FIG. 19 includes the second protective layers 41c (relatively densely dotted areas in the drawing) shaped into islands. Here, in the fold portion B, each of the second routed wires 42 illustrated in FIG. 19 includes a plurality of wire openings 42*m* arranged in the longitudinal direction of, and penetrating, the second routed wire 42. The second protective layers 41*c* illustrated in FIG. 19 include second protective layers 41*ca* provided to the fold portion B and second protective layers 42*cb* provided out of the fold portion B. Each of the second protective layers 41*ca* illustrated in FIG. 19 includes a corresponding one of a plurality of protective-layer openings 41*cm* penetrating the second protective layer 41*ca* to match a corresponding one of the wire openings 42*m*. The second protective layers 41*ca* and 41*cb* illustrated in FIG. 19 are provided to match transversely opposing ends of the second routed wires 42. Thanks to such a feature, each of the second routed wires 42 includes the wire openings 42*m*. When the organic EL display device 50*bb* is folded at the fold portion B, the feature makes it possible to disperse the stress on the second routed wires 42 and to reduce the risk of the second routed wires 42 to be broken.

Figure 20:
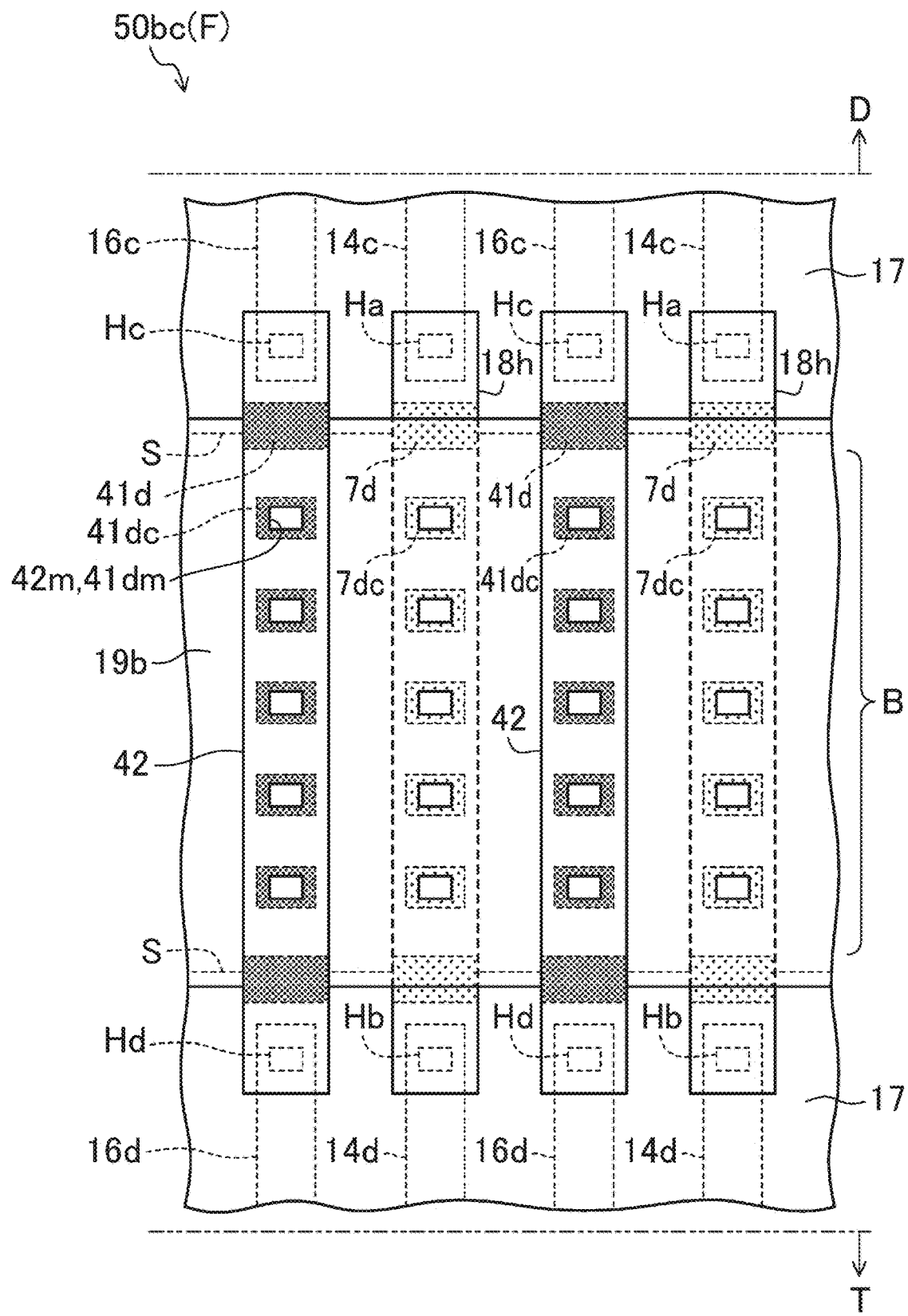
FIG. 20 is a plan view illustrating the frame region in a third modification of the organic EL display device according to the second embodiment of the disclosure.

The frame region F of the organic EL display device 50*bc* illustrated in FIG. 20 includes the second protective layers 41*d* (relatively densely dotted areas in the drawing) shaped into islands and provided to longitudinally opposing ends of each of the second routed wires 42 to overlap an end of the second resin layer 19*b*. Here, in the fold portion B, each of the second routed wires 42 illustrated in FIG. 20 includes the wire openings 42*m* arranged in the longitudinal direction of, and penetrating, the second routed wire 42. Moreover, as illustrated in FIG. 20, each of the second routed wires 42 has a longitudinal center including a plurality of second island layers 41*dc* formed of the same material, and in the same layer, as the second protective layers 41*d*. As illustrated in FIG. 20, each of the second island layers 41*dc* includes an opening 41*dm* penetrating the second island layer 41*dc* to match a corresponding one of the wire openings 42*m*. The second island layers 41*dc* are included in a transverse center of each of the second routed wires 42, so that the second routed wire 42 and the second resin layer 19*b* come into contact with each other at transversely opposing ends of the second routed wire 42. The second protective layers 41*d* illustrated in FIG. 20 are provided to match transversely opposing ends of the second routed wires 42. Thanks to such a feature, each of the second routed wires 42 includes the wire openings 42*m*. When the organic EL display device 50*bc* is folded at the fold portion B, the feature makes it possible to disperse the stress on the second routed wires 42 and to reduce the risk of the second routed wires 42 to be broken.

Figure 21:
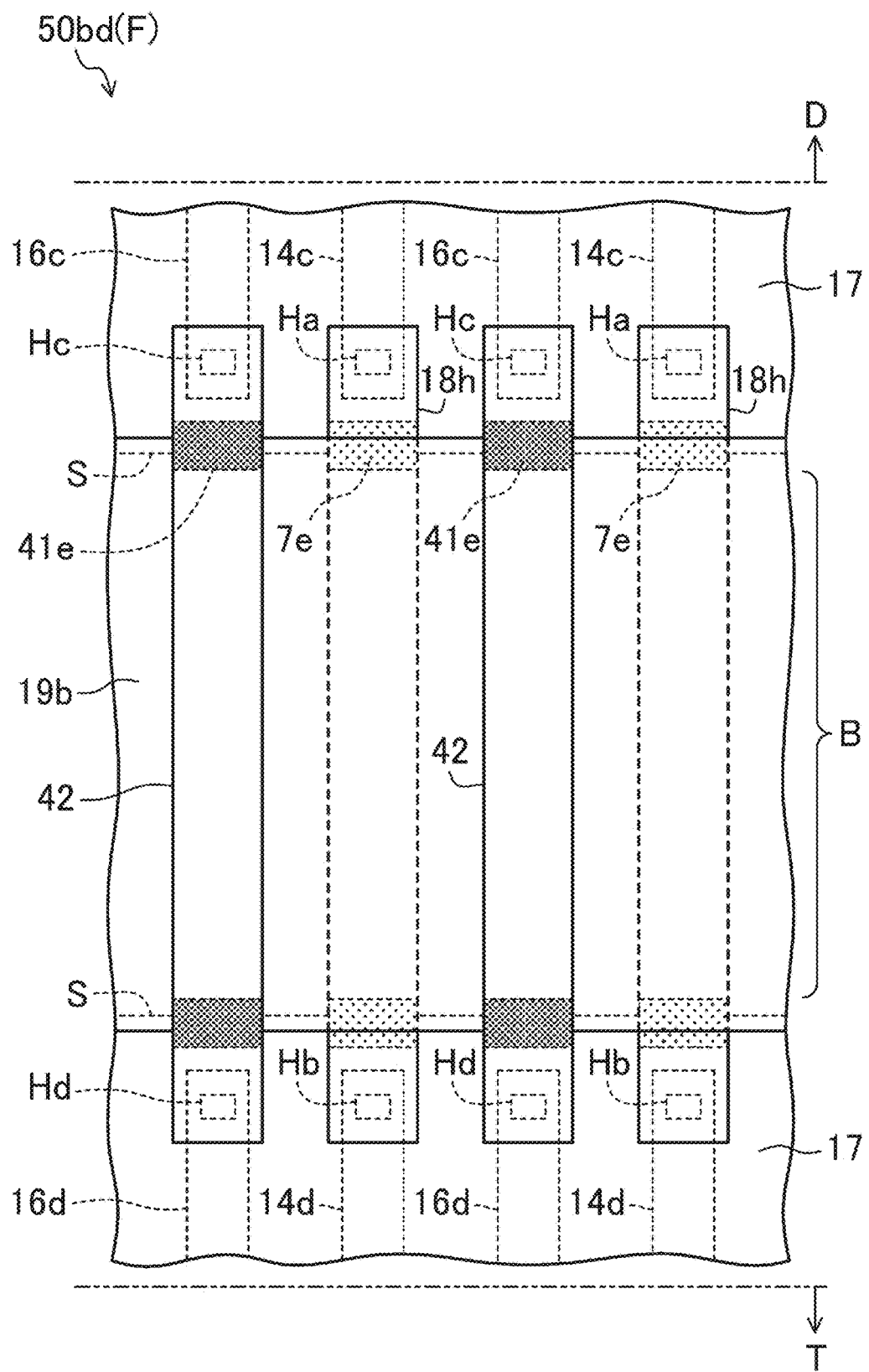
FIG. 21 is a plan view illustrating the frame region in a fourth modification of the organic EL display device according to the second embodiment of the disclosure.

The frame region F of the organic EL display device 50*bd* illustrated in FIG. 21 includes the second protective layers 41*e* (relatively densely dotted areas in the drawing) arranged between the first contact hole Ha and the second contact hole Hb of each of the second routed wires 42, and provided at longitudinally opposing ends of the second routed wire 42. Here, as illustrated in FIG. 21, the second protective layers 41*e* are provided to match transversely opposing ends of the second routed wires 42. Thanks to such a feature, the fold portion B does not include the second protective layers 41*e*. The feature makes it possible to reduce the risk of a crack opening on an inorganic insulating film when the organic EL display device 50*bd* is folded at the fold portion B, and to reduce the risk of the second routed wires 42 to be broken.

Figure 22:
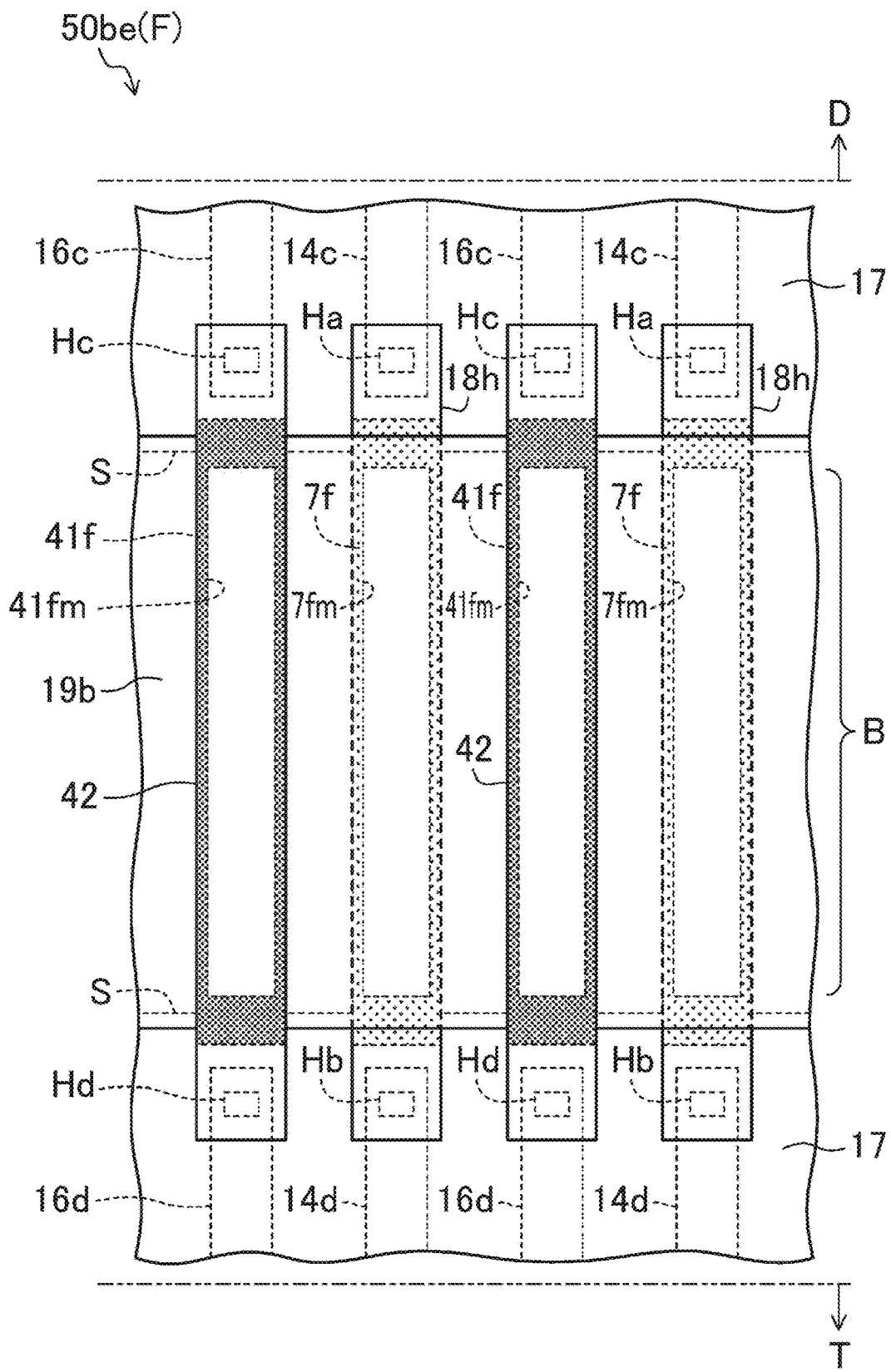
FIG. 22 is a plan view illustrating the frame region in a fifth modification of the organic EL display device according to the second embodiment of the disclosure.

The frame region of the organic EL display device 50*be* illustrated in FIG. 22 includes the second protective layers 41*f* (relatively densely dotted areas in the drawing) each disposed between the third contact hole Hc and the fourth contact hole Hd of one of the second routed wires 42, and connecting together the longitudinally opposing ends of the second routed wire 42. Here, as illustrated in FIG. 22, each of the second protective layers 41*f* includes in the fold portion B a protective-layer opening 41*fm* penetrating the second protective layer 41*f*. The second protective layers 41*f* illustrated in FIG. 22 are provided to match transversely opposing ends of the second routed wires 42. Thanks to such a feature, the surface of the second resin layer 19*b* exposed from the protective-layer openings 41*fm* is covered with the second routed wires 42. Hence, the feature keeps the surface of the second resin layer 19*b* from having contact with chlorine gas to be used for patterning of the second routed wires 42, making it possible to reliably reduce the risk of contamination inside a chamber of a dry-etching apparatus.

Similar to the organic EL display device 50*a* of the above first embodiment, the organic EL display device 50*b* is flexible, and allows, in each of the sub-pixels P, the light-emitting layer 3 of the organic EL layer 23 to appropriately emit light through the first TFTs 9*a* and the second TFTs 9*b* to display an image.

The organic EL display device 50*b* according to this embodiment is produced by the method for producing the organic EL display device 50*a* according to the first embodiment. After the second resin layer 19*a* is formed, the method additionally includes steps for forming the second protective layers 41*a*, the second routed wires 42, and a third resin layer 43.

As can be seen, the organic EL display device 50*b* according to this embodiment includes the second protective layer 41*a* formed between, and in contact with, the second resin layer 19*b* and the second routed wires 42, and provided to at least partially coincide with each of the second routed wires 42. The second protective layers 41*a* are provided to match the transversely opposing ends of each of the second routed wires 42. Hence, each of the second protective layers 41*a* is etched with a resist pattern as a mask for forming the second routed wires 42. Hence, in forming the second routed wires 42 by dry-etching using chlorine-based gas, the surface of the second resin layer 19*b* is covered with a protective film to serve as the second protective layers 41*a*. After that, using fluorine-based gas, the protective film between the neighboring second routed wires 42 is removed by dry-etching so that the second protective layers 41*a* are formed. Consequently, the surface of the second resin layer 19*b* is exposed between the neighboring second routed wires 42. Such a feature keeps the second resin layer 19*b* and the chlorine-based gas from coming into contact with each other inside a chamber of a dry-etching apparatus, making it possible to reduce the risk of contamination inside the chamber of the dry-etching apparatus.

Moreover, in the organic EL display device 50*b* according to this embodiment, the second protective layers 41*a* are shaped into a plurality of islands and arranged in the longitudinal direction of the second routed wires 42. Hence, even if the organic EL display device 50*b* is folded at the fold portion B, the second protective layers 41*a* are less likely to have a crack, making it possible to reduce the risk of the second routed wires 42 to be broken.

Other Embodiments

In the above embodiments, each organic EL layer is formed of a multilayer including such five layers as the hole-injection layer, the hole-transport layer, the light-emitting layer, the electron-transport layer, and the electron-injection layer. Alternatively, the organic EL layer may be formed of a multilayer including such three layers as a hole-injection and hole-transport layer, the light-emitting layer, and an electron-transport and electron-injection layer.

Moreover, in the organic EL display devices of the above embodiments described as examples, the first electrodes are anodes and the second electrodes are cathodes. Alternatively, the disclosure is applicable to an organic EL display device whose multilayered structure is inverted so that the first electrodes are cathodes and the second electrodes are anodes.

Furthermore, in the organic EL display devices of the above embodiments described as examples, the electrodes of the TFTs connected to the first electrodes are drain electrodes. Alternatively, the disclosure is also applicable to an organic EL display device in which the electrodes of the TFTs connected to the first electrodes are referred to as source electrodes.

In addition, the display devices of the embodiments described as examples are organic EL display devices. Alternatively, the disclosure is applicable to a display device including a plurality of light-emitting elements driven by current. For example, the disclosure is applicable to a display device including quantum-dot light emitting diodes (QLEDs); that is, light-emitting elements using layers containing quantum dots.

INDUSTRIAL APPLICABILITY

As can be seen, the disclosure is applicable to a flexible display device.

The invention claimed is:

1. A display device, comprising:
a resin substrate defining a display region, a frame region around the display region, a terminal unit at an end of the frame region, and a fold portion provided between the terminal unit and the display region and extending in a single direction;
a TFT layer provided on the resin substrate, and including a plurality of display wires formed in the display region, the display wires extending in parallel with one an other, and intersecting with a longitudinal direction of the fold portion;
a plurality of light-emitting elements provided on the TFT layer and included in the display region;
a plurality of terminals included in the terminal unit and arranged in the longitudinal direction of the fold portion;
at least one inorganic insulating film provided on the resin substrate, included in the TFT layer, and including a slit formed in the longitudinal direction of the fold portion;
a first resin layer provided to fill the slit;
a plurality of first routed wires provided above the first resin layer, extending in parallel with one an other and intersecting with the longitudinal direction of the fold portion, and each electrically connected to a corresponding one of the display wires toward the display region and to a corresponding one of the terminals toward the terminal unit; and
a first protective layer formed between, and in contact with, the first resin layer and the first routed wires, and provided to at least partially coincide with each of the first routed wires, wherein
the first protective layer includes a plurality of first protective layers provided to match a transverse end of each of the first routed wires.

2. The display device according to claim 1, wherein the first protective layers are shaped into a plurality of islands arranged in a longitudinal direction of the first routed wires.

3. The display device according to claim 1, wherein each of the first protective layers includes a plurality of protective-layer openings arranged in a longitudinal direction of the first routed wires and penetrating the first protective layer.

4. The display device according to claim 2, wherein in the fold portion, each of the first routed wires includes a plurality of wire openings arranged in the longitudinal direction of, and penetrating, the first routed wire, and
in the fold portion, each of the first protective layers shaped into the islands includes a corresponding one of a plurality of protective-layer openings penetrating the first protective layer to match a corresponding one of the wire openings.

5. The display device according to claim 1, wherein the first protective layers are provided to longitudinally opposing ends of each of the first routed wires to overlap an end of the first resin layer.

6. The display device according to claim 5, wherein in the fold portion, each of the first routed wires includes a plurality of wire openings arranged in the longitudinal direction of, and penetrating, the first routed wire, and
each of the first routed wires has a longitudinal center including a plurality of first island layers formed of the same material, and in the same layer, as the first protective layers,
each of the first island layers includes a corresponding one of a plurality of openings penetrating the first island layer to match a corresponding one of the wire openings, and
the first island layers are included in a transverse center of each of the first routed wires, so that the first routed wire and the first resin layer come into contact with each other at transversely opposing ends of the first routed wire.

7. The display device according to claim 1, further comprising
a plurality of first led wires included in the frame region, extending in parallel with one an other closer toward the display region than toward the fold portion, and provided closer to the resin substrate than to the first routed wires; and
a plurality of second led wires included in the frame region, extending in parallel with one an other closer toward the terminal unit than toward the fold portion, and provided closer to the resin substrate than to the first routed wires, wherein
each of the first routed wires is electrically connected to a corresponding one of the first led wires through a first contact hole formed in the at least one organic insulating film, and to a corresponding one of the second led wires through a second contact hole formed in the at least one organic insulating film.

8. The display device according to claim 5, wherein each of the first protective layers connects together the longitudinally opposing ends of one of the first routed wires, and includes in the fold portion a protective-layer opening penetrating the first protective layer.

9. The display device according to claim 1, wherein the first protective layer includes a silicon oxide film.

10. The display device according to claim 1, further comprising:
a second resin layer provided to cover the first routed wires;

a plurality of second routed wires provided above the second resin layer, extending in parallel with one an other and intersecting with the longitudinal direction of the fold portion, and each electrically connected to a corresponding one of the display wires toward the display region and to a corresponding one of the terminals toward the terminal unit; and a second protective layer formed between, and in contact with, the second resin layer and the second routed wires, and provided to at least partially coincide with each of the second routed wires.

11. The display device according to claim 10, wherein the second protective layer includes a plurality of second protective layers provided to match a transverse end of each of the second routed wires.

12. The display device according to claim 11, wherein the second protective layers are shaped into a plurality of islands arranged in a longitudinal direction of the second routed wires.

13. The display device according to claim 11, wherein each of the second protective layers includes a plurality of protective-layer openings arranged in a longitudinal direction of the second routed wires and penetrating the second protective layer.

14. The display device according to claim 12, wherein in the fold portion, each of the second routed wires includes a plurality of wire openings arranged in the longitudinal direction of, and penetrating, the second routed wire, and in the fold portion, each of the second protective layers shaped into the islands includes a corresponding one of a plurality of protective-layer openings matching a corresponding one of the wire openings.

15. The display device according to claim 11, wherein the second protective layers are provided to longitudinally opposing ends of each of the second routed wires to overlap an end of the second resin layer.

16. The display device according to claim 15, wherein in the fold portion, each of the second routed wires includes a plurality of wire openings arranged in the longitudinal direction of, and penetrating, the second routed wire, each of the second routed wires has a longitudinal center including a plurality of second island layers formed of the same material, and in the same layer, as the second protective layers, each of the second island layers includes a corresponding one of a plurality of openings penetrating the second island layer to match a corresponding one of the wire openings, and the second island layers are included in a transverse center of each of the second routed wires, so that the second routed wire and the second resin layer come into contact with each other at transversely opposing ends of the second routed wire.

17. The display device according to claim 11, further comprising:

a plurality of third led wires included in the frame region, extending in parallel with one an other closer toward the display region than toward the fold portion, and provided closer to the resin substrate than to the second routed wires; and a plurality of fourth led wires included in the frame region, extending in parallel with one an other closer toward the terminal unit than toward the fold portion, and provided closer to the resin substrate than to the second routed wires, wherein each of the second routed wires is electrically connected to a corresponding one of the third led wires through a third contact hole formed in the at least one organic insulating film, and to a corresponding one of the fourth led wires through a fourth contact hole formed in the at least one organic insulating film.

18. The display device according to claim 15, wherein each of the second protective layers connects together the longitudinally opposing ends of one of the second routed wires, and includes in the fold portion a protective-layer opening penetrating the second protective layer.

19. The display device according to claim 10, wherein the second protective layer includes a silicon oxide film.

20. The display device according to claim 1, wherein each of the light-emitting elements is an organic electroluminescence (EL) element.

* * * * *